(12) United States Patent
Oh

(10) Patent No.: US 10,505,142 B2
(45) Date of Patent: Dec. 10, 2019

(54) ORGANIC LIGHT EMITTING DISPLAY AND METHOD OF FABRICATING THE SAME

(71) Applicant: LG DISPLAY CO., LTD., Seoul (KR)

(72) Inventor: Jae-Young Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/637,728

(22) Filed: Jun. 29, 2017

(65) Prior Publication Data

US 2018/0006265 A1 Jan. 4, 2018

(30) Foreign Application Priority Data

Jun. 30, 2016 (KR) .................. 10-2016-0083006

(51) Int. Cl.
| H01L 51/52 | (2006.01) |
| H01L 51/00 | (2006.01) |
| H01L 27/32 | (2006.01) |
| G06F 3/041 | (2006.01) |
| G06F 3/044 | (2006.01) |
| H01L 51/50 | (2006.01) |

(52) U.S. Cl.
CPC ...... *H01L 51/5237* (2013.01); *H01L 27/3276* (2013.01); *H01L 51/0017* (2013.01); *H01L 51/5206* (2013.01); *G06F 3/044* (2013.01); *G06F 3/0412* (2013.01); *H01L 27/323* (2013.01); *H01L 27/3288* (2013.01); *H01L 51/5008* (2013.01)

(58) Field of Classification Search
CPC .............. H01L 27/3225; H01L 27/323; H01L 51/5237; G06F 3/0412; G06F 3/044
See application file for complete search history.

(56) References Cited

U.S. PATENT DOCUMENTS

| 9,292,118 | B2 * | 3/2016 | Lee ................. G06F 3/0412 |
| 2014/0117316 | A1 * | 5/2014 | Choi ................ H01L 51/5253 257/40 |
| 2014/0145979 | A1 * | 5/2014 | Lee ................. G06F 3/0412 345/173 |
| 2014/0160047 | A1 * | 6/2014 | Choi ................ G06F 3/0412 345/173 |

(Continued)

FOREIGN PATENT DOCUMENTS

| KR | 10-2012-0060926 A | 6/2012 |
| KR | 10-2014-0069708 A | 6/2014 |

(Continued)

*Primary Examiner* — Mariceli Santiago
(74) *Attorney, Agent, or Firm* — Birch, Stewart, Kolasch & Birch, LLP

(57) ABSTRACT

An organic light emitting display can include a plurality of light emitting elements disposed on a substrate; an encapsulation unit disposed on the plurality of light emitting elements and including a plurality of inorganic encapsulation layers and at least one organic encapsulation layer disposed between the plurality of inorganic encapsulation layers; and a plurality of touch sensing lines and a plurality of touch driving lines intersecting each other, in which at least one of the plurality of inorganic encapsulation layers or the at least one organic encapsulation layer is disposed between the plurality of touch sensing lines and the plurality of touch driving lines at locations where the plurality of touch sensing lines cross the plurality of touch driving lines.

19 Claims, 18 Drawing Sheets

(56) References Cited

U.S. PATENT DOCUMENTS

| | | | |
|---|---|---|---|
| 2016/0154499 A1* | 6/2016 | Bae | G06F 3/044 |
| | | | 345/174 |
| 2016/0306479 A1* | 10/2016 | Zhu | G06F 3/044 |
| 2016/0307971 A1* | 10/2016 | Jeon | H01L 27/3258 |
| 2017/0365813 A1* | 12/2017 | Kamiya | G06F 3/0412 |
| 2018/0033829 A1* | 2/2018 | Oh | G06F 3/03547 |
| 2018/0061899 A1* | 3/2018 | Oh | G06F 3/0412 |

FOREIGN PATENT DOCUMENTS

| | | |
|---|---|---|
| KR | 10-2015-0001019 A | 1/2015 |
| KR | 10-2015-0026921 A | 3/2015 |
| KR | 10-2016-0043577 A | 4/2016 |

\* cited by examiner

ORGANIC LIGHT EMITTING DISPLAY AND METHOD OF FABRICATING THE SAME

CROSS-REFERENCE TO RELATED APPLICATIONS

This application claims the benefit of Korean Patent Application No. 10-2016-0083006, filed on Jun. 30, 2016, which is hereby incorporated by reference as if fully set forth herein.

BACKGROUND OF THE INVENTION

Field of the Invention

The present invention relates to an organic light emitting display and a method of fabricating the same, and more particularly, to an organic light emitting display which can achieve weight reduction and slimming, and a method of fabricating the same.

Discussion of the Related Art

A touchscreen is an input device through which a user may input a command by selecting instructions displayed on a screen of a display, using a hand or an object. That is, the touchscreen converts a contact position directly contacting a human hand or an object into an electrical signal and receives instructions selected at the contact position as an input signal. Such a touchscreen may substitute for a separate input device connected to a display device and operated, such as a keyboard or a mouse, and thus applications of touchscreens have gradually increased.

In general, a touchscreen is attached to the front surface of a display panel, such as a liquid crystal display panel or an organic electroluminescent display panel. In this instance, since the touchscreen is separately manufactured and then attached to the front surface of the display panel, an attachment process is additionally performed and thus the overall process becomes complicated and manufacturing costs are raised. Further, the overall thickness of the display panel is increased by the touchscreen and it may be difficult to secure flexibility and transmittance due to the increased thickness.

SUMMARY OF THE INVENTION

Accordingly, the present invention is directed to an organic light emitting display and a method of fabricating the same that substantially obviates one or more problems due to limitations and disadvantages of the related art.

An object of the present invention is to provide an organic light emitting display which can achieve weight reduction and slimming, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display includes light emitting elements disposed on a substrate, an encapsulation unit disposed on the light emitting elements and including a plurality of inorganic encapsulation layers and at least one organic encapsulation layer disposed between the inorganic encapsulation layers, and touch sensing lines and touch driving lines disposed so as to intersect each other such that at least one of the inorganic encapsulation layers and the at least one organic encapsulation layer is interposed therebetween.

Both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
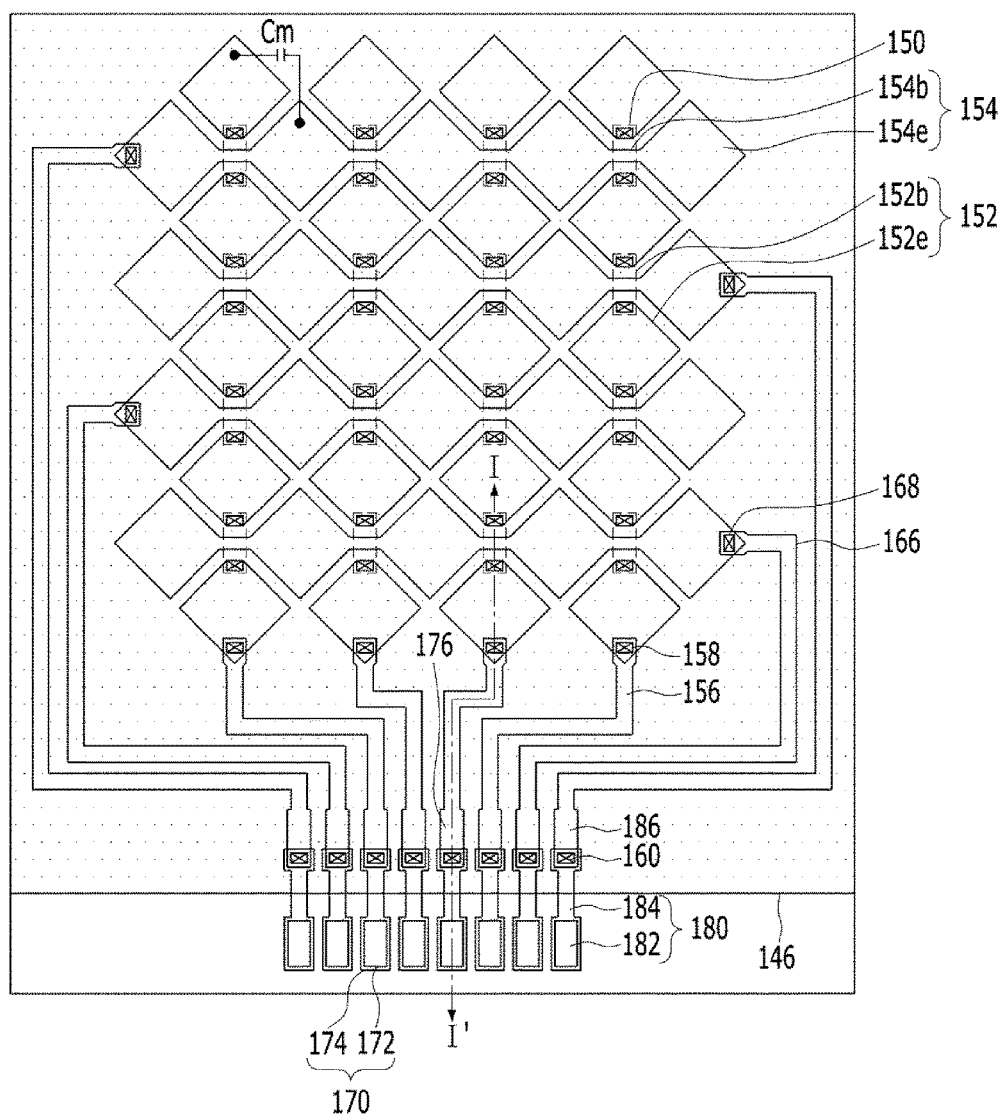
FIG. 1 is a plan view of an organic light emitting display having touch sensors in accordance with one embodiment of the present invention.
Figure 2:
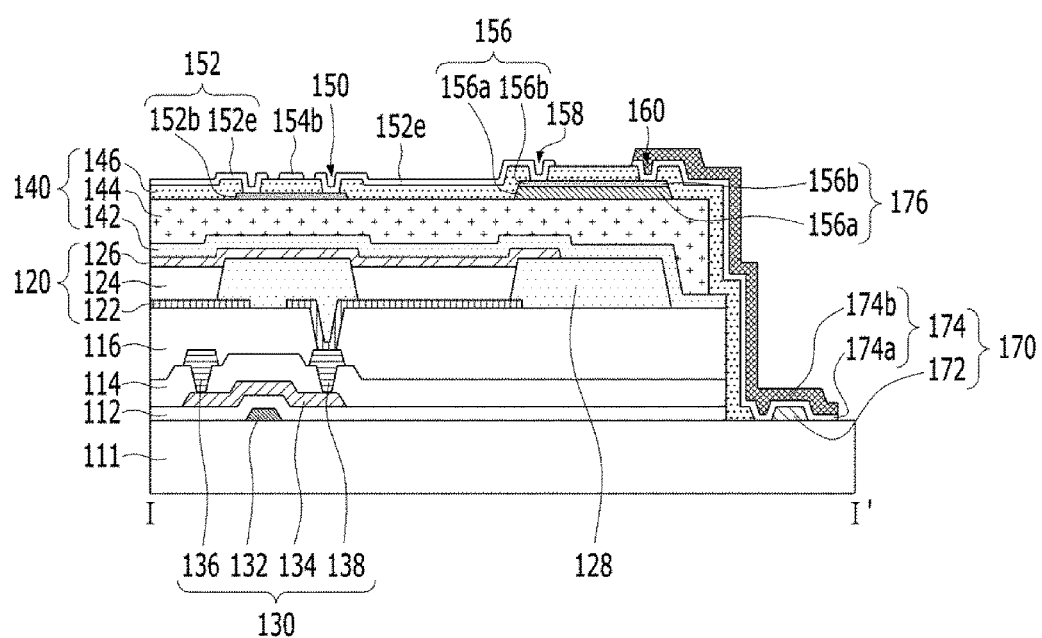
FIG. 2 is a cross-sectional view of the organic light emitting display, taken along line I-I' of FIG. 1.

FIGS. 1 and 2 are plan and cross-sectional views of an organic light emitting display having touch sensors in accordance with one embodiment of the present invention.

An organic light emitting display having touch sensors shown in FIGS. 1 and 2 includes at least one switching thin film transistor, at least one driving thin film transistor 130, light emitting elements 120, an encapsulation unit 140, touch driving lines 152 and touch sensing lines 154.

The at least one switching thin film transistor and the at least one driving thin film transistor are formed on a lower substrate 111 formed of plastic or glass.

The switching thin film transistor is connected to a gate line and a data line at the intersection therebetween, and the driving thin film transistor 130 is connected to the switching thin film transistor and a power line.

The driving thin film transistor 130 includes, as an example shown in FIG. 2, a gate electrode 132, a semiconductor layer 134 overlapping the gate electrode 132 with a gate insulating film 112 interposed therebetween, and source and drain electrodes 136 and 138 formed on a first protective film 114 and contacting the semiconductor layer 134.

The light emitting element 120 includes an anode 122, an organic light emitting layer 124 formed on the anode 122, and a cathode 126 formed on the organic light emitting layer 124.

The anode 122 is conductively connected to the drain electrode 138 of the driving thin film transistor 130 exposed through a pixel contact hole formed through a second protective film 116. The organic light emitting layer 124 is formed on the anode 122 in an emission region provided by a bank 128. The organic light emitting layer 124 is formed by stacking a hole-related layer, a light emitting layer and an electron-related layer on the anode 122 in regular order or in reverse order. The cathode 126 is formed opposite the anode 122 with the organic light emitting layer 124 interposed therebetween.

The encapsulation unit 140 prevents external moisture or oxygen from penetrating through the light emitting element 120, which is vulnerable to external moisture or oxygen. For this purpose, the encapsulation unit 140 includes a plurality of inorganic encapsulation layers 142 and 146 and an organic encapsulation layer 144 disposed between the inorganic encapsulation layers 142 and 146, and the inorganic encapsulation layer 146 is disposed as the uppermost layer. Here, the encapsulation unit 140 includes at least two inorganic encapsulation layers 142 and 146 and at least one organic encapsulation layer 144. In the present invention, the structure of the encapsulation unit 140 in which the organic encapsulation layer 144 is disposed between the first and second inorganic encapsulation layers 142 and 146 will be exemplarily described.

The first encapsulation layer 142 is formed on the substrate 111 provided with the cathode 126 so as to be located most adjacent to the light emitting element 120. The first encapsulation layer 142 is formed to expose touch driving pads 170 and touch sensing pads 180. Such a first encapsulation layer 142 is formed to have a monolayer or multilayer structure using an inorganic insulating material which can be deposited at a low temperature, such as silicon nitride ($SiN_x$), silicon oxide ($SiO_x$), silicon oxynitride (SiON) or aluminum oxide ($Al_2O_3$). Therefore, damage to the organic light emitting layer 124 by a high-temperature atmosphere during a deposition process of the first encapsulation layer 142 can be prevented.

The organic encapsulation layer 144 is formed to have a smaller area than that of the first inorganic encapsulation layer 142 and exposes both ends of the first inorganic encapsulation layer 142. The organic encapsulation layer 144 serves as a buffer to damp stress between respective layers according to warpage of the organic light emitting display and strengthens planarization performance of the organic light emitting display. The organic encapsulation layer 144 is formed to have a monolayer or multilayer structure using an organic insulating material, such as acrylic resin, epoxy resin, a polymeric resin (for example, polyimide or polyethylene) or silicon oxycarbide (SiOC).

The second inorganic encapsulation layer 146 is formed on the substrate 111 provided with the organic encapsulation layer 144 formed thereon so as to cover the upper and side surfaces of the organic encapsulation layer 144 and the first inorganic encapsulation layer 142. Therefore, the second inorganic encapsulation layer 146 minimizes or blocks penetration of external moisture or oxygen into the first inorganic encapsulation layer 142 and the organic encapsulation layer 144. Such a second inorganic encapsulation layer 146 is formed to have a monolayer or multilayer structure using an inorganic insulating material, such as silicon nitride ($SiN_x$), silicon oxide ($SiO_x$), silicon oxynitride (SiON) or aluminum oxide ($Al_2O_3$).

The touch sensing lines 154 and the touch driving lines 152 are disposed so as to intersect each other such that at least one of the first and second inorganic encapsulation layers 142 and 146 and the organic encapsulation layer 144 of the encapsulation unit 140 is interposed therebetween. In this embodiment of the present invention, a structure, in which the touch sensing lines 154 and the touch driving lines 152 are disposed so as to intersect each other such that the uppermost layer, i.e., the second inorganic encapsulation layer 146, of the encapsulation unit 140 is interposed therebetween, will be exemplarily described.

The touch driving line 152 includes a plurality of first touch electrodes 152e, and first bridges 152b to conductively connect the first touch electrodes 152e.

The first touch electrodes 152e are spaced apart from each other in the Y-axis direction by designated intervals on the second inorganic encapsulation layer 146. Each of the first touch electrodes 152e is conductively connected to the adjacent first touch electrode 152e through the first bridge 152b.

The first bridges 152b are formed on the organic encapsulation layer 144, are exposed through touch contact holes 150 formed through the second inorganic encapsulation layer 146, and are conductively connected to the first touch electrodes 152e. The first bridge 152b is disposed so as to overlap the bank 128 and, thus, lowering of an aperture ratio due to the first bridges 152b can be prevented.

The touch sensing line 154 includes a plurality of second touch electrodes 154e, and second bridges 154b to conductively connect the second touch electrodes 154e.

The second touch electrodes 154e are spaced apart from each other in the X-axis direction by designated intervals on the second inorganic encapsulation layer 146. Each of the second touch electrodes 154e is conductively connected to the adjacent second touch electrode 154e through the second bridge 154b.

The second bridges 154b are disposed on the second inorganic encapsulation layer 146 so as to be coplanar with the second touch electrodes 154e, and thus are conductively connected to the second touch electrodes 154e without separate contact holes. In the same manner as the first bridge 152b, the second bridge 154b is disposed so as to overlap the bank 128 and, thus, lowering of an aperture ratio due to the second bridges 154b can be prevented.

Since the touch sensing lines 154 and the touch driving lines 152 intersect each other with the second inorganic encapsulation layer 146 interposed therebetween, mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

The touch driving lines 152 of the present invention are connected to a touch driving unit through first routing lines 156, first routing pads 176 and the touch driving pads 170 disposed in an edge area. Further, the touch sensing lines 154 are connected to the touch driving unit through second routing lines 166, second routing pads 186 and the touch sensing pads 180 disposed in the edge area.

The first routing line 156 is conductively connected to the first touch electrode 152e through a first routing contact hole 158 and thus transmits a touch driving pulse from the touch driving pad 170 to the touch driving line 152. The second routing line 166 is conductively connected to the second touch electrode 154e through a second routing contact hole 168 and thus transmits a touch signal from the touch sensing line 154 to the touch sensing pad 180.

The first and second routing lines 156 and 166 are formed to have a multilayer structure. For example, each of the first routing lines 156 has a structure in which a first routing conductive layer 156a and a second routing conductive layer 156b are stacked, and each of the second routing lines 166 has a structure in which a first routing conductive layer and a second routing conductive layer are stacked. Here, the first routing conductive layer 156a is formed to have a monolayer or multilayer structure using Al, Ti, Cu or Mo, and the second routing conductive layer 156b is formed of an ITO, IZO, IGZO or ZnO-based transparent conductive oxide, which is the same material as the first bridges 152b, on the first routing conductive layer 156a. Therefore, if any one of the first and second routing conductive layers 156a and 156b of each of the first and second routing lines 156 and 166 is cut, the other conductive layer transmits a touch driving pulse and a touch signal.

The first and second routing pads 176 and 186 respectively extend from the first and second routing lines 156 and 166 and thus have a structure in which first and second conductive layers 156a and 156b are stacked in the same manner as the first and second routing lines 156 and 166. The first routing pads 176 conductively connect the first routing lines 156 and the touch driving pads 170, and the second routing pads 186 conductively connect the second routing lines 166 and the touch sensing pads 180.

Each of the touch driving pads 170 and the touch sensing pads 180 includes a pad electrode 172 or 182 and a pad connection electrode 174 or 184 disposed on the pad electrode 172 or 182 so as to cover the pad electrode 172 or 182.

The pad connection electrodes 174 and 184 of the touch driving pads 170 and the touch sensing pads 180 are conductively connected to the first and second routing pads 176 and 186 exposed through pad contact holes 160 formed through the second inorganic encapsulation layer 146. Particularly, the pad connection electrodes 174 and 184 of the touch driving pads 170 and the touch sensing pads 180 are disposed on the upper and side surfaces of the uppermost layer of the encapsulation unit 140, i.e., the second inorganic encapsulation layer 146. Therefore, even if external oxygen or moisture penetrates through the pad connection electrodes 174 and 184, the organic encapsulation layer 144 and the first and second inorganic encapsulation layers 142 and 146 block oxygen or moisture and may thus protect the organic light emitting layer 124 from oxygen or moisture.

The pad electrodes 172 and 182 of the touch driving pads 170 and the touch sensing pads 180 are formed of a first conductive layer, and the pad connection electrodes 174 and 184 are formed to have a structure in which third and fourth conductive layers 174a and 174b are stacked. Here, the third conductive layer 174a is formed of an ITO, IZO, IGZO or ZnO-based transparent conductive oxide, and the fourth conductive layer 174b is formed to have a monolayer or multilayer structure using metals having high corrosion resistance and acid resistance, such as Al, Ti, Cu and Mo. For example, the fourth conductive layer 174b has a tri-layer structure, such as Ti/Al/Ti or Mo/Al/Mo.

As such, in the organic light emitting display in accordance with this embodiment of the present invention, the touch driving lines 152 and the touch sensing lines 154 are disposed so as to intersect each other with the second inorganic encapsulation layer 146 of the encapsulation unit 140 interposed therebetween and, thus, a touch insulating layer disposed between touch driving lines and touch sensing lines is not required, thereby achieving structure simplification, weight reduction and slimming. That is, the organic light emitting display in accordance with the present invention includes the first and second inorganic encapsulation layers 142 and 146 and the organic encapsulation layer 144 of the encapsulation unit 140 disposed on the cathode 126 without a separate touch insulating layer. Further, a related art organic light emitting display includes an encapsulation unit having at least a tri-layer structure, and at least one touch insulating layer included in a touchscreen including first and second touch electrodes. In this instance, the organic light emitting display in accordance with the present invention does not require a touch insulating layer, as compared to the related art organic light emitting display, and can thus achieve structure simplification, weight reduction and slimming, assure flexibility and improve transmittance. Further, while, in the related art organic light emitting display, a touchscreen is attached to a display panel through an adhesive, in the organic light emitting display in accordance with the present invention, the touch electrodes 152e and 154e are disposed in the encapsulation unit 140, a separate attachment process is omitted and, thus, process simplification and cost reduction can be achieved.

FIGS. 3A to 3D are plan and cross-sectional views illustrating a method of fabricating the organic light emitting display shown in FIGS. 1 and 2.

Figure 3A:
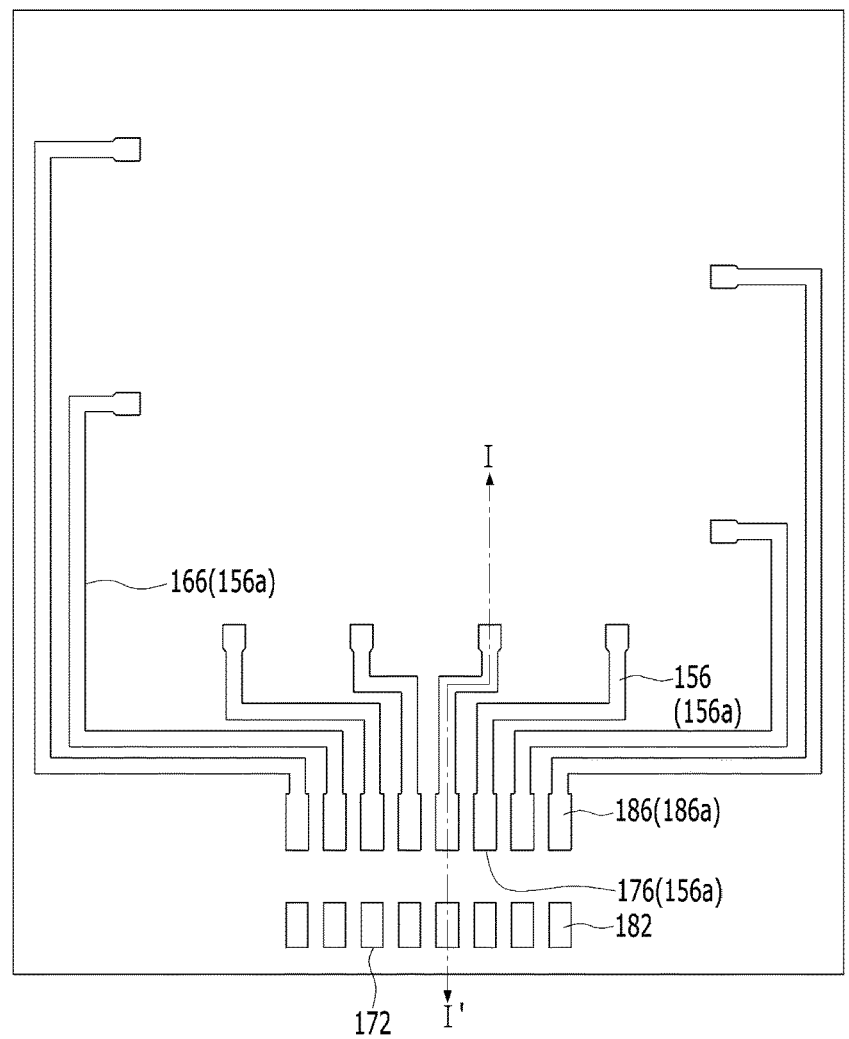
FIGS. 3A to 3D are plan and cross-sectional views illustrating a method of fabricating the organic light emitting display shown in FIGS. 1 and 2 according to an embodiment.
Figure 3A:
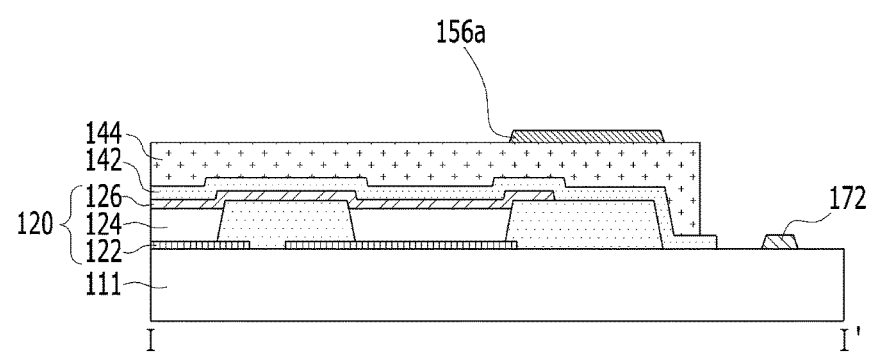

With reference to FIG. 3A, the first inorganic encapsulation layer 142, the organic encapsulation layer 144, the pad electrodes 172 and 182, the first and second routing pads 176 and 186, the first conductive layer 156a of the first routing lines 156 and the first conductive layer of the second routing lines 166 are formed on the substrate 111 provided with the switching transistors, the driving transistors, the anodes 122, the organic light emitting layer 124 and the cathodes 126 formed thereon.

In more detail, an inorganic insulating material and an organic insulating material are sequentially stacked on the substrate 111, provided with the switching transistors, the driving transistors, the anodes 122, the organic light emitting layer 124 and the cathodes 126 formed thereon, through a deposition process using a metal mask, thereby forming the first inorganic encapsulation layer 142 and the organic encapsulation layer 144. The first inorganic encapsulation layer 142 and the organic encapsulation layer 144 are formed in other regions except for a region in which touch driving pads and touch signal pads will be formed. Thereafter, a first conductive layer is deposited on the entire surface of the organic encapsulation layer 144, and the first conductive layer is then patterned through a photolithography process and an etching process, thereby forming the first and second routing pads 176 and 186, the first conductive layer 156a of the first routing lines 156, the first conductive layer of the second routing lines 166 and the pad electrodes 172 and 182. Here, the first conductive layer 156*a* and the pad electrodes 172 and 182 are formed to have a monolayer or multilayer structure using metals having high corrosion resistance and acid resistance, such as Al, Ti, Cu and Mo. For example, the first conductive layer 156*a* has a tri-layer structure, such as Ti/Al/Ti or Mo/Al/Mo.

Figure 3B:
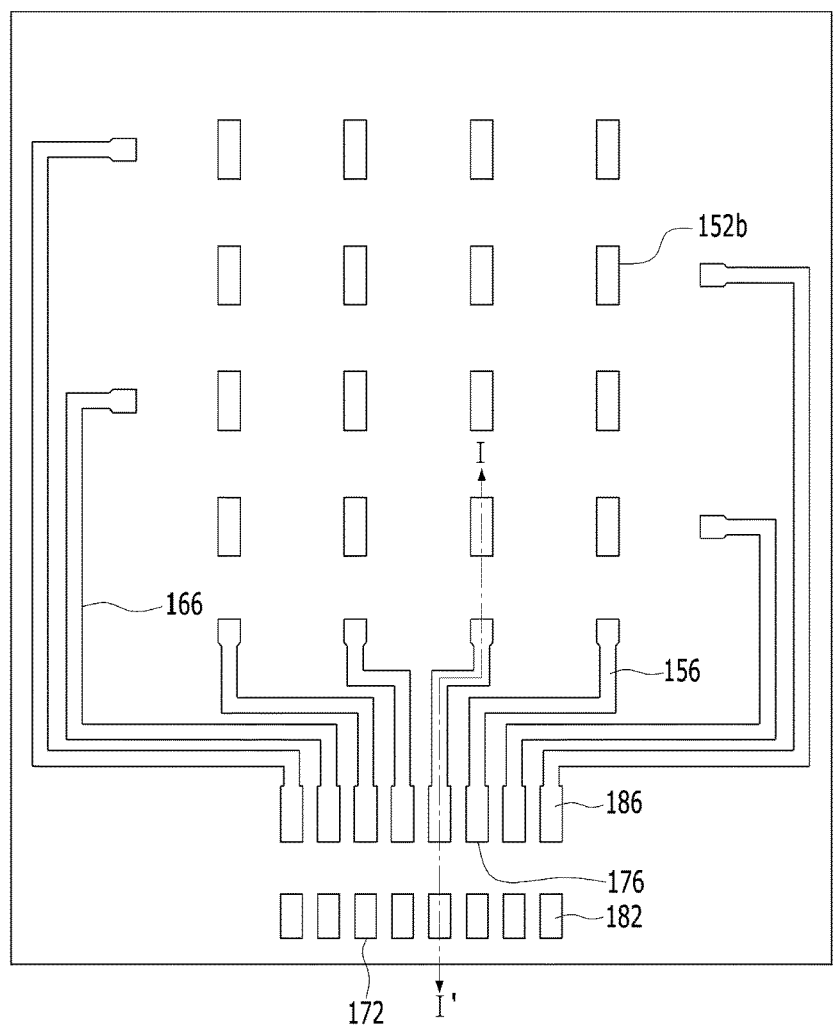
Figure 3B:
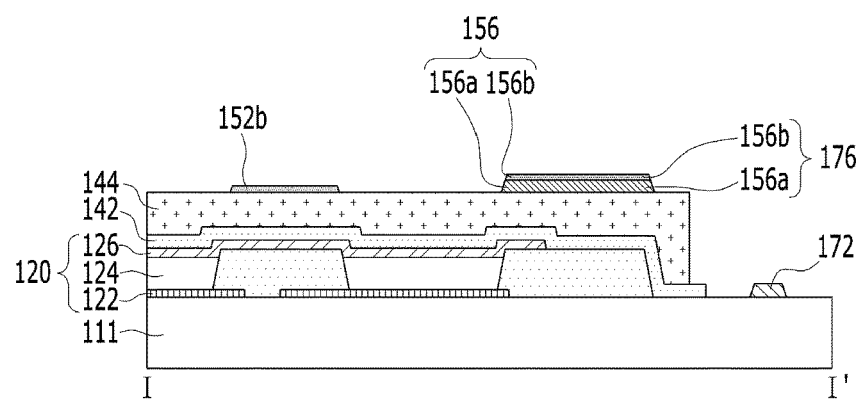

Thereafter, with reference to FIG. 3B, the first and second routing pads 176 and 186, the second conductive layer 156*b* of the first routing lines 156, the second conductive layer of the second routing lines 166 and the first bridges 152*b* are formed on the substrate 111 provided with the first conductive layer 156*a* and the pad electrodes 172 and 182.

In more detail, a second conductive layer is deposited on the entire surface of the substrate 111 provided with the first conductive layer 156*a* and the pad electrodes 172 and 182, and the second conductive layer is then patterned through a photolithography process and an etching process, thereby forming the first and second routing pads 176 and 186, the second conductive layer 156*b* of the first routing lines 156, the second conductive layer of the second routing lines 166 and the first bridges 152*b*. Here, the second conductive layer 156*b* and the first bridge 152*b* are formed of a transparent conductive layer, such as an ITO, IZO, IGZO or ZnO-based transparent conductive oxide.

Figure 3C:
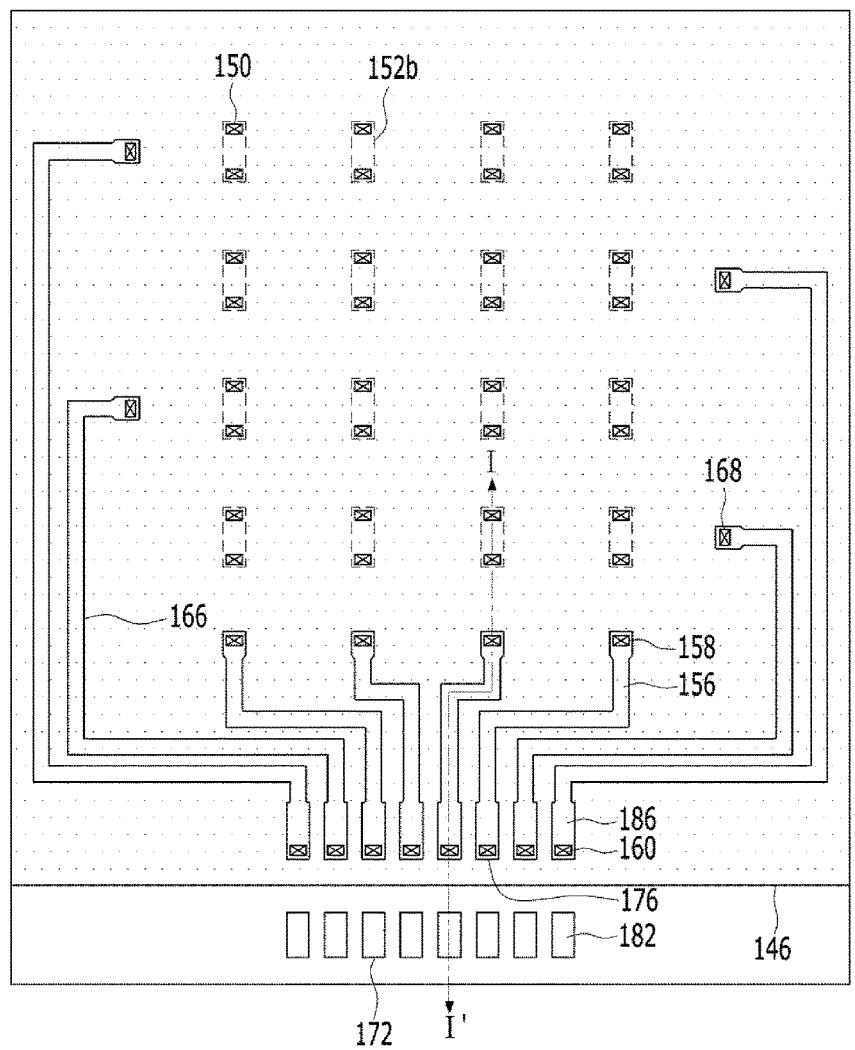
Figure 3C:
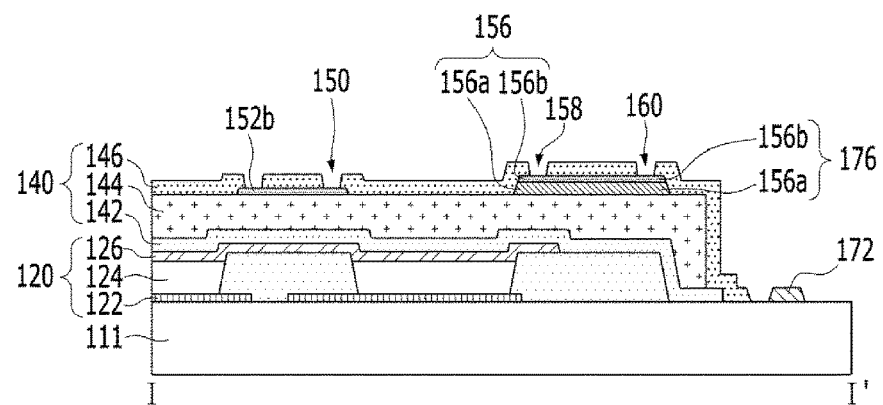

Thereafter, with reference to FIG. 3C, the second inorganic encapsulation layer 146 having the touch contact holes 150, the first and second routing contact holes 158 and 168 and the pad contact holes 160 is formed on the substrate 111 provided with the second conductive layer 156*b* and the first bridges 152*b*.

In more detail, an inorganic insulating material is deposited on the substrate 111 provided with the second conductive layer 156*b* and the first bridges 152*b* through a deposition process using a metal mask so as to expose pad electrodes, thereby forming the second inorganic encapsulation layer 146. Thereafter, the second inorganic encapsulation layer 146 is patterned through a photolithography process and an etching process, thereby forming the touch contact holes 150, the routing contact holes 158 and 168 and the pad contact holes 160. The touch contact holes 150 are formed through the second inorganic encapsulation layer 146 and thus expose the first bridges 152*b*, the first and second routing contact holes 158 and 168 are formed through the second inorganic encapsulation layer 146 and thus expose the first and second routing lines 156 and 166, and the pad contact holes 160 are formed through the second inorganic encapsulation layer 146 and thus expose the first and second routing pads 176 and 186.

Figure 3D:
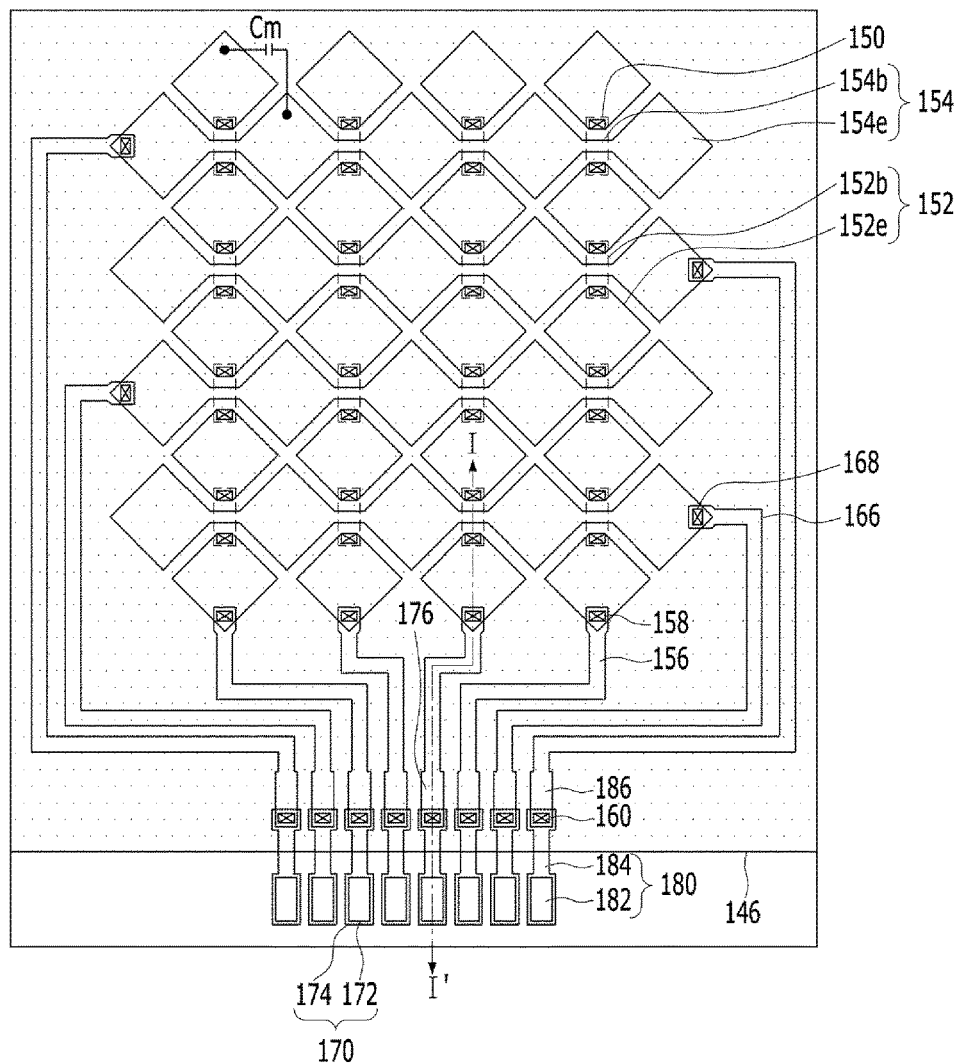
Figure 3D:
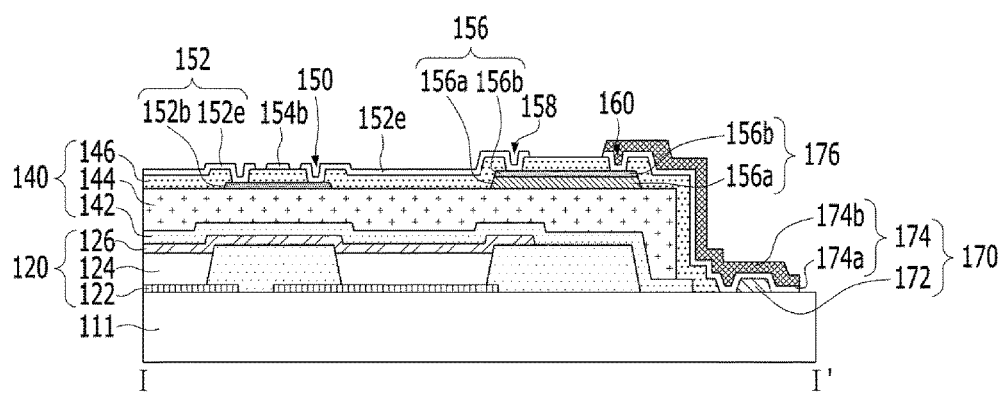

Thereafter, with reference to FIG. 3D, the first and second touch electrodes 152*e* and 154*e*, the second bridges 154*b* and the pad connection electrodes 174 and 184 are formed on the substrate 111 provided with the second inorganic encapsulation layer 146.

In more detail, third and fourth conductive layers are deposited on the entire surface of the substrate 111 provided with the second inorganic encapsulation layer 146 and, then, a photoresist pattern having a multi-stepped structure is formed on the fourth conductive layer through a photolithography process using a slit mask or a diffraction mask. The third and fourth conductive layers are primarily etched through an etching process using such a photoresist pattern as a mask. Thereafter, after ashing of the photoresist pattern, the fourth conductive layer is secondarily etched through an etching process using the ashed photoresist pattern as a mask. Thereby, the first and second touch electrodes 152*e* and 154*e* and the second bridges 154*b* formed of the third conductive layer 174*a* are formed and, simultaneously, the pad connection electrodes 174 and 184, in which the third and fourth conductive layers 174*a* and 174*b* are stacked, are formed. Here, the first touch electrodes 152*e* are conductively connected to the first bridges 152*b* exposed through the touch contact holes 150, and the pad connection electrodes 174 and 184 are conductively connected to the first and second routing pads 176 and 186 exposed through the pad contact holes 160 and are directly connected to the pad electrodes 172 and 182 without contact holes.

Figure 4:
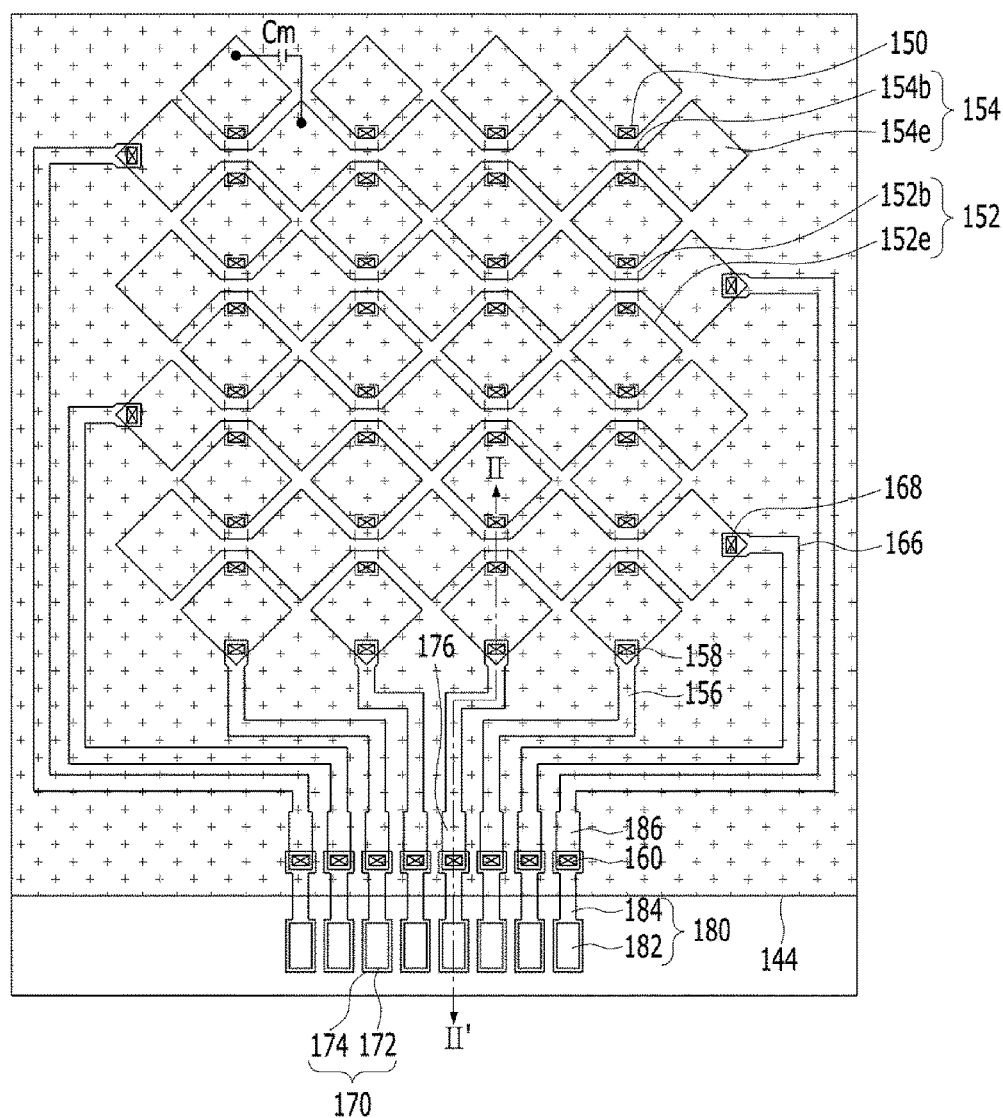
FIG. 4 is a plan view of an organic light emitting display having touch sensors in accordance with a further embodiment of the present invention.
Figure 5:
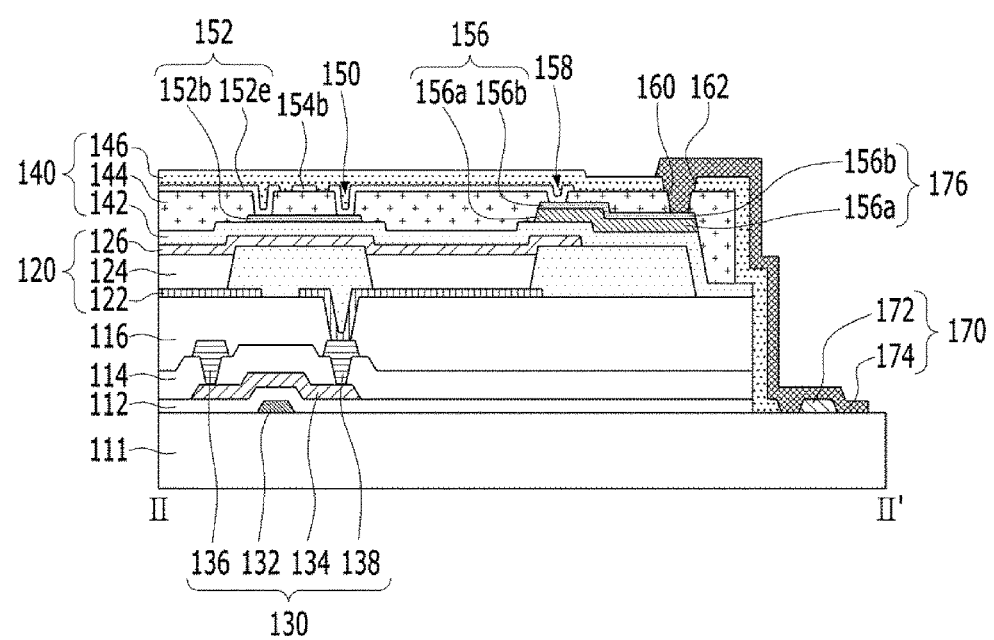
FIG. 5 is a cross-sectional view of the organic light emitting display, taken along line II-II' of FIG. 4.

FIG. 4 is a plan view of an organic light emitting display having touch sensors in accordance with a further embodiment of the present invention, and FIG. 5 is a cross-sectional view of the organic light emitting display, taken along line II-II' of FIG. 4.

The organic light emitting display shown in FIGS. 4 and 5 is the same as the organic light emitting display shown in FIGS. 1 and 2, except that touch sensing lines 154 and touch driving lines 152 are disposed so as to intersect each other with an organic encapsulation layer 144 interposed therebetween. Therefore, a detailed description of elements of the organic light emitting display shown in FIGS. 4 and 5, which are substantially the same as those of the organic light emitting display shown in FIGS. 1 and 2, will be omitted because it is considered to be unnecessary.

The touch driving line 152 includes a plurality of first touch electrodes 152*e* disposed on the organic encapsulation layer 144, and first bridges 152*b* to conductively connect the first touch electrodes 152*e*. The first bridges 152*b* are formed on a first inorganic encapsulation layer 142 and exposed through touch contact holes 150 formed through the organic encapsulation layer 144, and are conductively connected to the first touch electrodes 152*e*.

The touch sensing line 154 includes a plurality of second touch electrodes 154*e*, and second bridges 154*b* to conductively connect the second touch electrodes 154*e*. The second touch electrodes 154*e* and the second bridges 154*b* are disposed on the organic encapsulation layer 144 and conductively connected to each other without contact holes.

Since the touch sensing lines 154 and the touch driving lines 152 intersect each other with the organic encapsulation layer 144 interposed therebetween, mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

Each of touch driving pads 170 and touch sensing pads 180 includes a pad electrode 172 or 182 and a pad connection electrode 174 or 184 disposed on the pad electrode 172 or 182 so as to cover the pad electrode 172 or 182. The pad connection electrodes 174 and 184 of the touch driving pads 170 and the touch sensing pads 180 are conductively connected to first and second routing pads 176 and 186 exposed through first pad contact holes 160 formed through the organic encapsulation layer 144 and second pad contact holes 162 formed through a second inorganic encapsulation layer 146. The pad electrodes 172 and 182 of the touch driving pads 170 and the touch sensing pads 180 are formed of a first conductive layer, and the pad connection electrodes 174 and 184 are formed of a fourth conductive layer having a monolayer or multilayer structure using metals having high corrosion resistance and acid resistance, such as Al, Ti, Cu and Mo. For example, the fourth conductive layer has a tri-layer structure, such as Ti/Al/Ti or Mo/Al/Mo.

As such, in the organic light emitting display in accordance with this embodiment of the present invention, the touch driving lines 152 and the touch sensing lines 154 are disposed so as to intersect each other with the organic encapsulation layer 144 of the encapsulation unit 140 interposed therebetween, thereby achieving structure simplification, weight reduction and slimming. In this instance, the organic light emitting display in accordance with the present invention does not require a touch insulating layer having a multilayer structure in a touchscreen, as compared to a related art organic light emitting display, and can thus achieve structure simplification, weight reduction and slimming, assure flexibility and improve transmittance. Further, while, in the related art organic light emitting display, a touchscreen is attached to a display panel through an adhesive, in the organic light emitting display in accordance with the present invention, the touch electrodes 152e and 154e are disposed in the encapsulation unit 140, a separate attachment process is omitted and, thus, process simplification and cost reduction can be achieved.

FIGS. 6A to 6F are plan and cross-sectional views illustrating a method of fabricating the organic light emitting display shown in FIGS. 4 and 5.

Figure 6A:
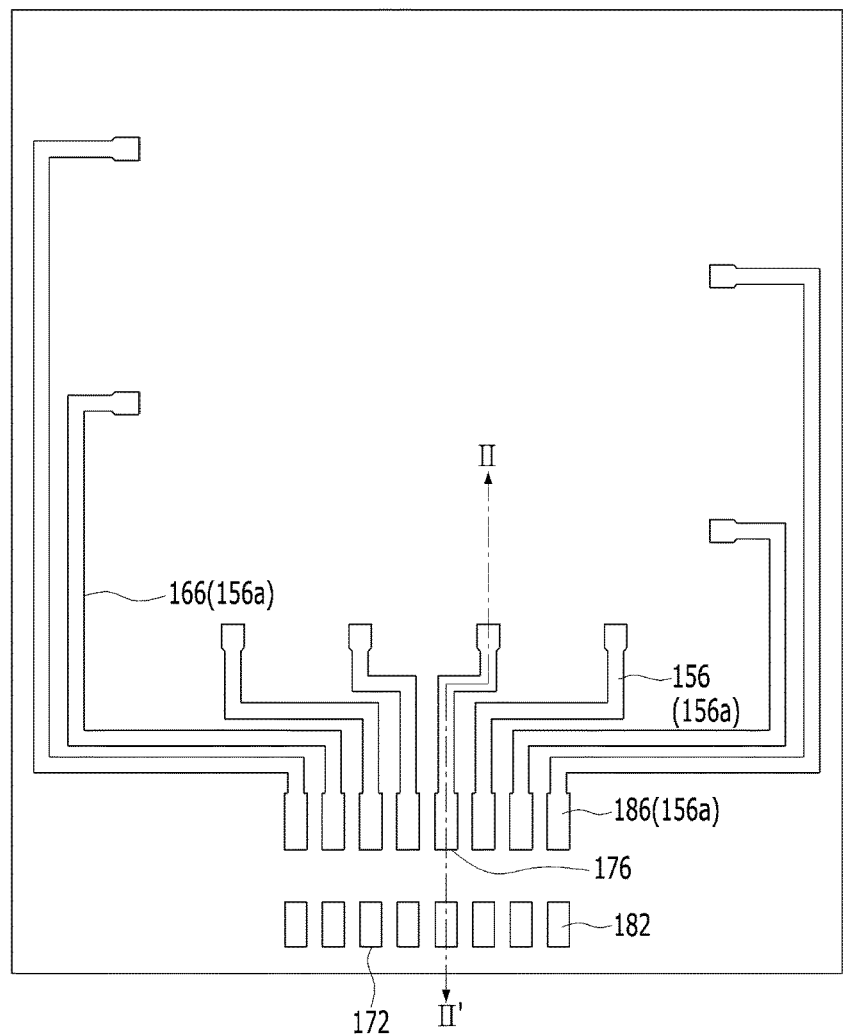
FIGS. 6A to 6F are plan and cross-sectional views illustrating a method of fabricating the organic light emitting display shown in FIGS. 4 and 5 according to an embodiment.
Figure 6A:
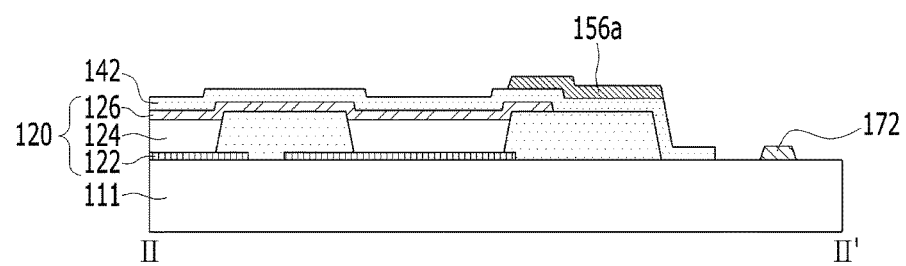

With reference to FIG. 6A, the first inorganic encapsulation layer 142, the pad electrodes 172 and 182, the first and second routing pads 176 and 186, the first conductive layer 156a of the first routing lines 156 and the first conductive layer of the second routing lines 166 are formed on the substrate 111 provided with switching transistors, driving transistors, anodes 122, the organic light emitting layer 124 and cathodes 126 formed thereon.

In more detail, an inorganic insulating material is stacked on the substrate 111, provided with the switching transistors, the driving transistors, the anodes 122, the organic light emitting layer 124 and the cathodes 126 formed thereon, through a deposition process using a metal mask, thereby forming the first inorganic encapsulation layer 142. The first inorganic encapsulation layer 142 is formed in other regions except for a region in which touch driving pads and touch signal pads will be formed. Thereafter, a first conductive layer is deposited on the entire surface of the first inorganic encapsulation layer 142, and the first conductive layer is then patterned through a photolithography process and an etching process, thereby forming the first and second routing pads 176 and 186, the first conductive layer 156a of the first routing lines 156, the first conductive layer of the second routing lines 166 and the pad electrodes 172 and 182. Here, the first conductive layer 156a and the pad electrodes 172 and 182 are formed to have a monolayer or multilayer structure using metals having high corrosion resistance and acid resistance, such as Al, Ti, Cu and Mo. For example, the first conductive layer 156a has a tri-layer structure, such as Ti/Al/Ti or Mo/Al/Mo.

Figure 6B:
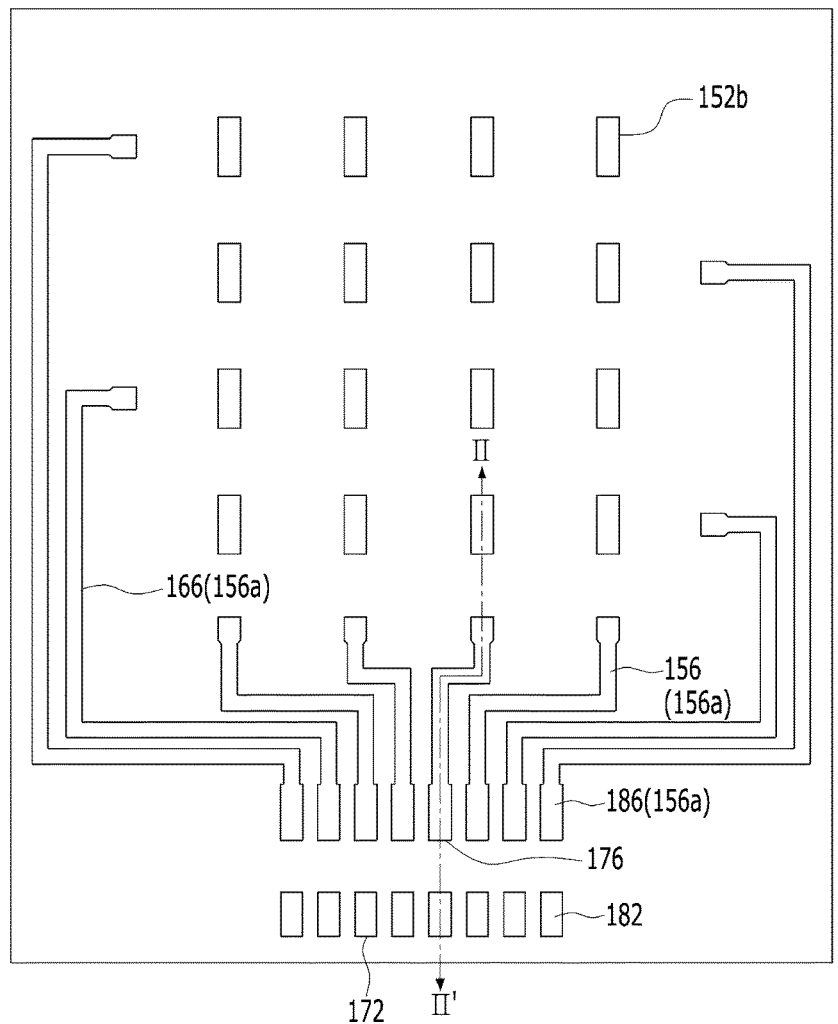
Figure 6B:
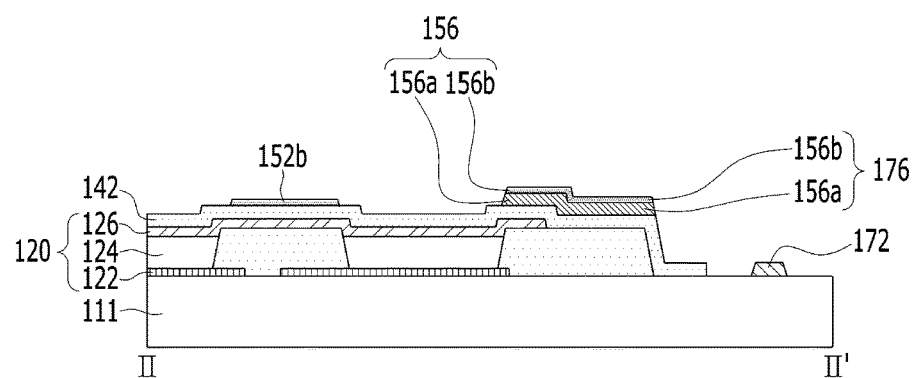

Thereafter, with reference to FIG. 6B, the first and second routing pads 176 and 186, the second conductive layer 156b of the first routing lines 156, the second conductive layer of the second routing lines 166 and the first bridges 152b are formed on the substrate 111 provided with the first conductive layer 156a and the pad electrodes 172 and 182.

In more detail, a second conductive layer is deposited on the entire surface of the substrate 111 provided with the first conductive layer 156a and the pad electrodes 172 and 182, and the second conductive layer is then patterned through a photolithography process and an etching process, thereby forming the first and second routing pads 176 and 186, the second conductive layer 156b of the first routing lines 156, the second conductive layer of the second routing lines 166 and the first bridges 152b. Here, the second conductive layer 156b and the first bridge 152b are formed of an ITO, IZO, IGZO or ZnO-based transparent conductive oxide.

Figure 6C:
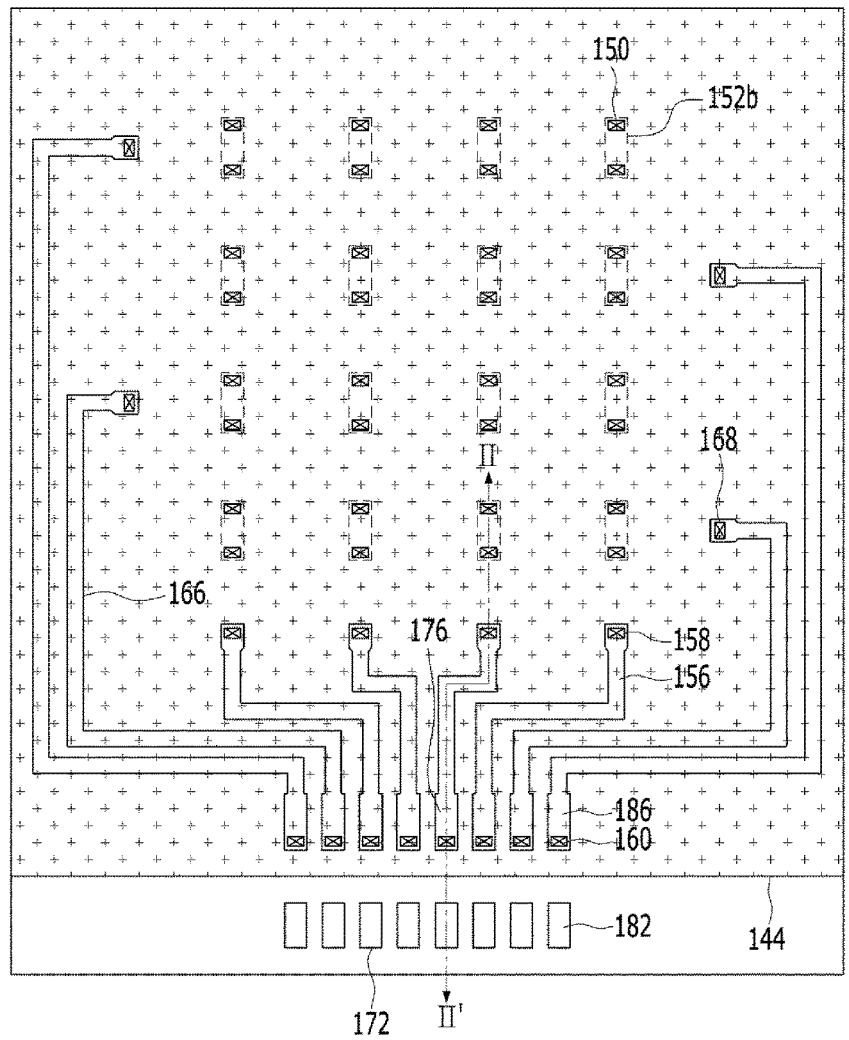
Figure 6C:
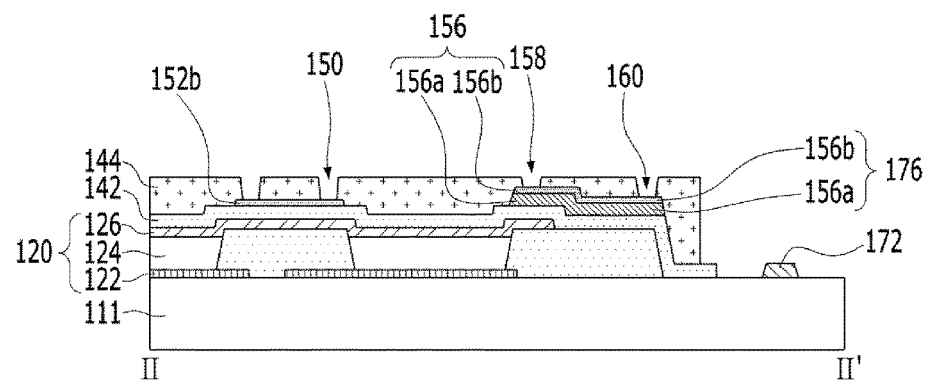

Thereafter, with reference to FIG. 6C, the organic encapsulation layer 144 having touch contact holes 150, first and second routing contact holes 158 and 168 and first pad contact holes 160 is formed on the substrate 111 provided with the second conductive layer 156b and the first bridges 152b.

In more detail, an organic insulating material is deposited on the substrate 111 provided with the second conductive layer 156b and the first bridges 152b through a deposition process using a metal mask so as to expose pad electrodes 172 and 182, thereby forming the organic encapsulation layer 144. Thereafter, the organic encapsulation layer 144 is patterned through a photolithography process and an etching process, thereby forming the touch contact holes 150, the routing contact holes 158 and 168 and the first pad contact holes 160. The touch contact holes 150 are formed through the organic encapsulation layer 144 and thus expose the first bridges 152b, the first and second routing contact holes 158 and 168 are formed through the organic encapsulation layer 144 and thus expose the first and second routing lines 156 and 166, and the first pad contact holes 160 are formed through the organic encapsulation layer 144 and thus expose the first and second routing pads 176 and 186.

Figure 6D:
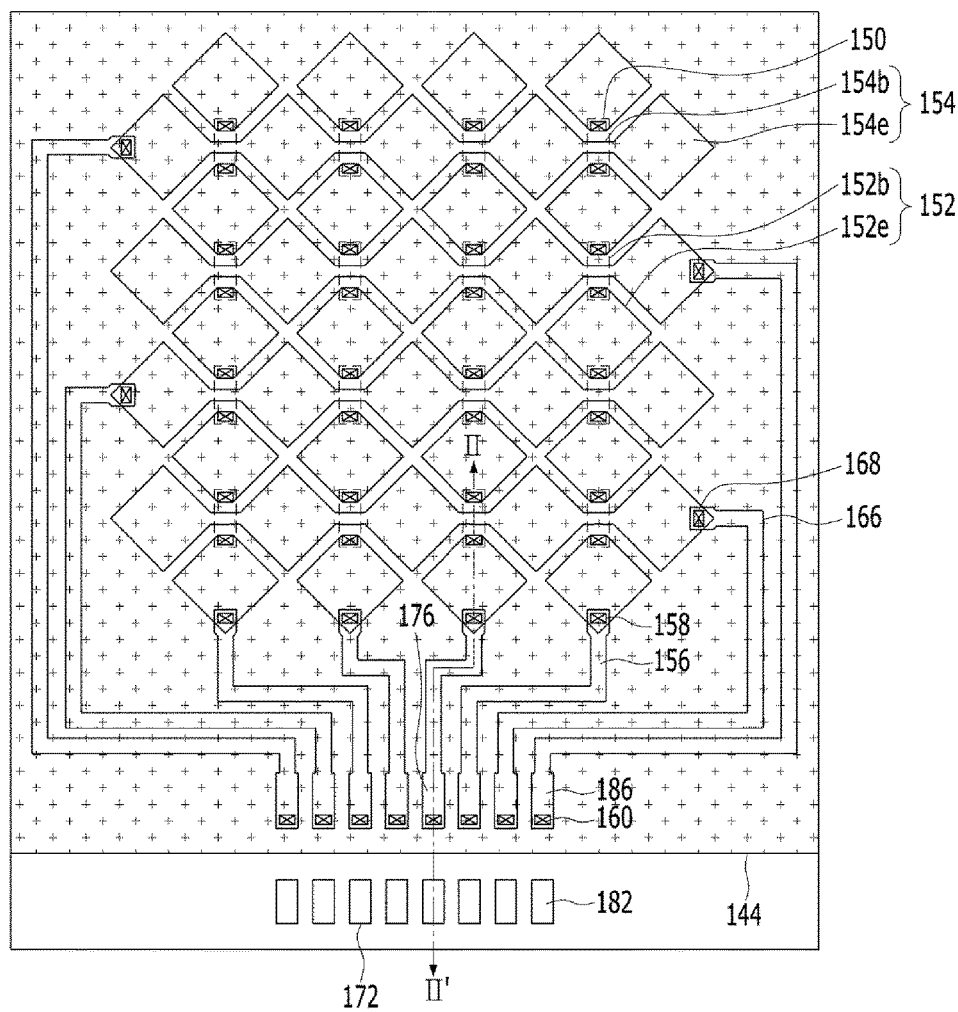
Figure 6D:
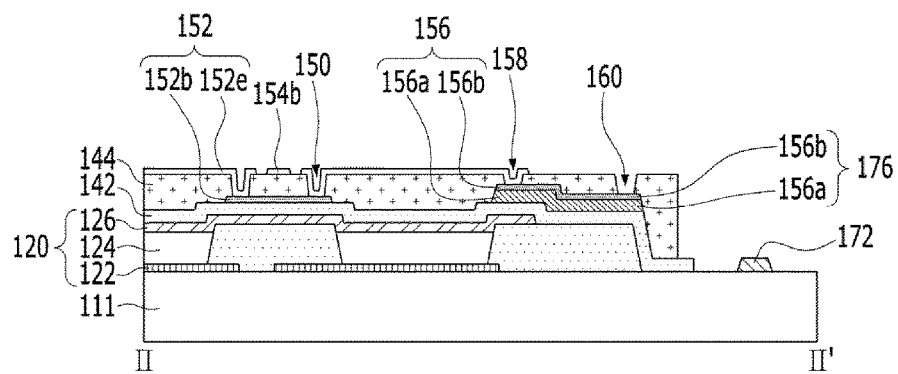

Thereafter, with reference to FIG. 6D, the first and second touch electrodes 152e and 154e and the second bridges 154b are formed on the substrate 111 provided with the organic encapsulation layer 144.

In more detail, a third conductive layer is deposited on the entire surface of the substrate 111 provided with the organic encapsulation layer 144, and the third conductive layer is then patterned through a photolithography process and an etching process, thereby forming the first and second touch electrodes 152e and 154e and the second bridges 154b. Here, the first touch electrodes 152e are conductively connected to the first bridges 152b exposed through the touch contact holes 150. Here, the third conductive layer is formed of an ITO, IZO, IGZO or ZnO-based transparent conductive oxide.

Figure 6E:
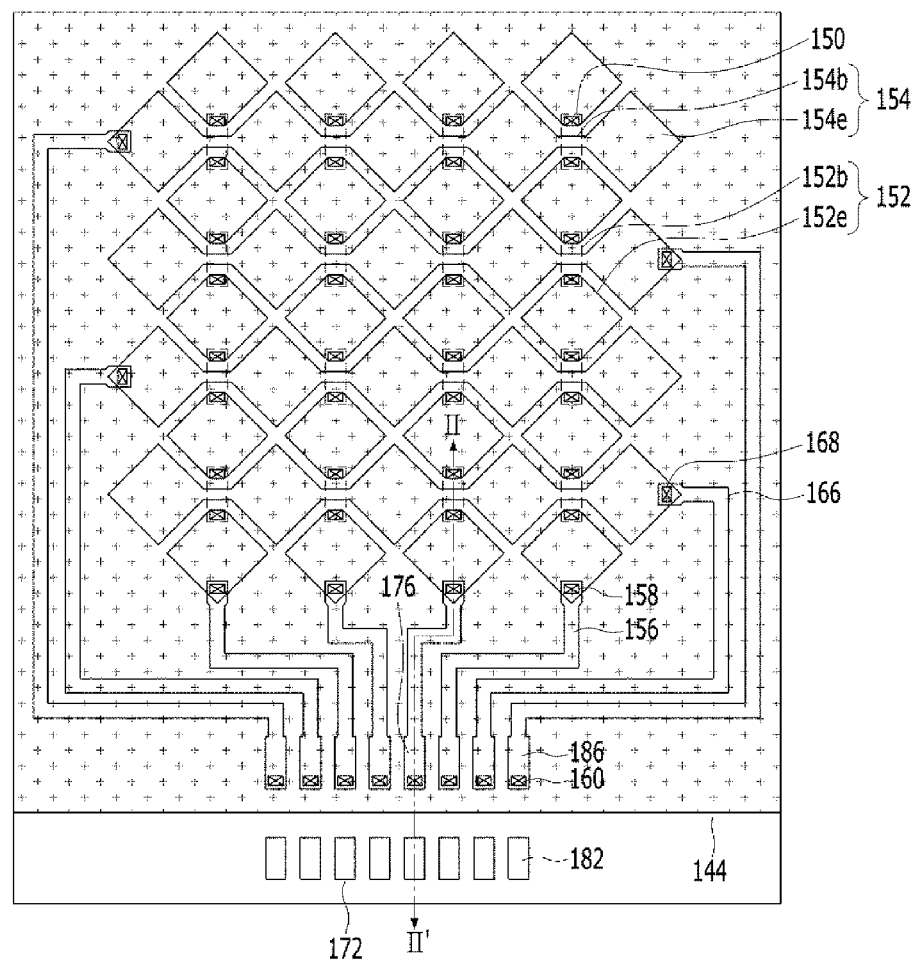
Figure 6E:
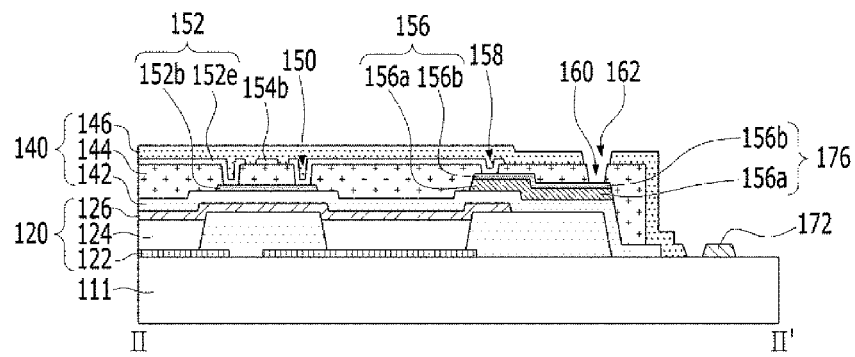

Thereafter, with reference to FIG. 6E, the second inorganic encapsulation layer 146 having second pad contact holes 162 is formed on the substrate 111 provided with the first and second touch electrodes 152e and 154e and the second bridges 154b.

In more detail, an inorganic insulating material is deposited on the substrate 111 provided with the first and second touch electrodes 152e and 154e and the second bridges 154b through a deposition process using a metal mask so as to expose the pad electrodes 172 and 182, thereby forming the second inorganic encapsulation layer 146. Thereafter, the second inorganic encapsulation layer 146 is patterned through a photolithography process and an etching process, thereby forming the second pad contact holes 162. The second pad contact holes 162 are formed through the second inorganic encapsulation layer 146, thus being connected to the first pad contact holes 160 vertically.

Figure 6F:
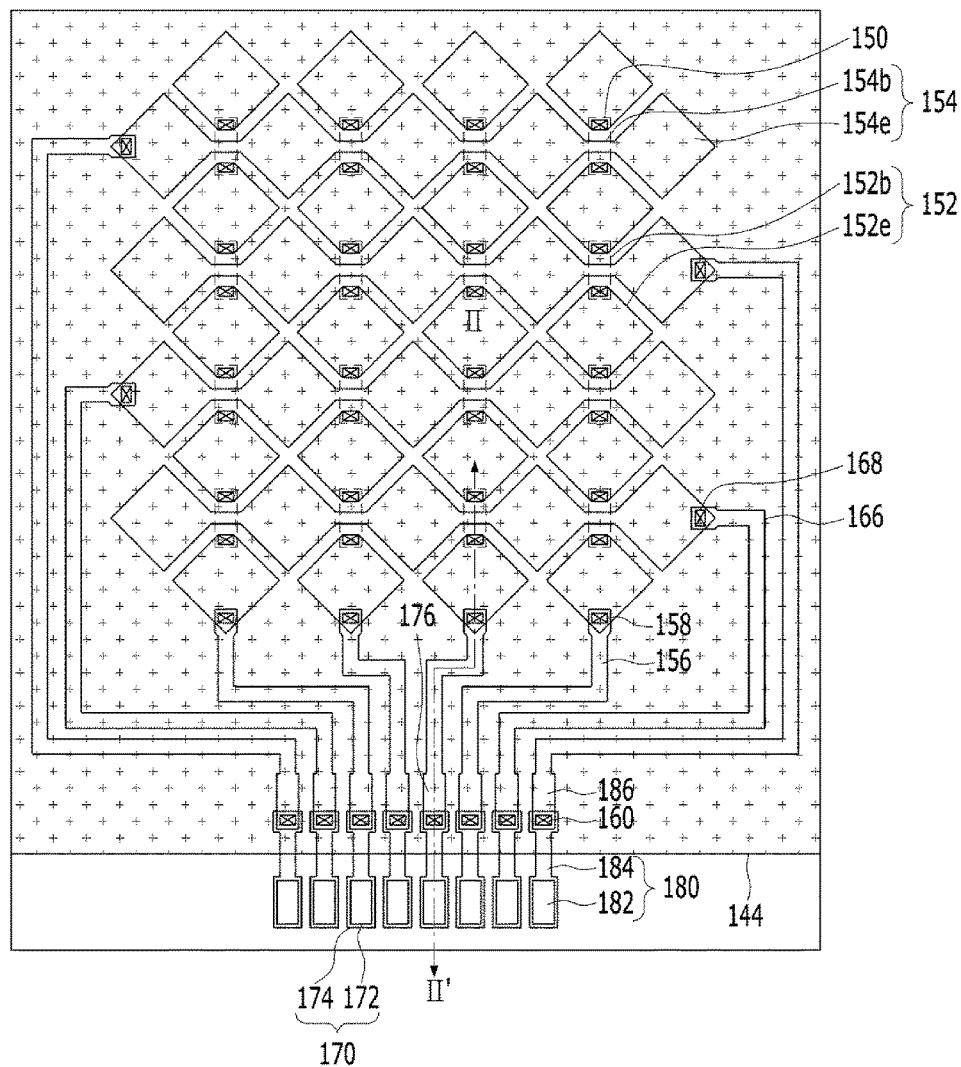
Figure 6F:
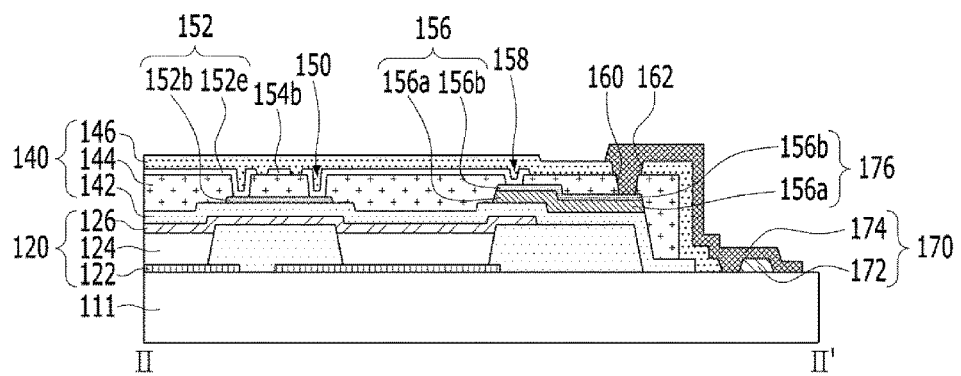

Thereafter, with reference to FIG. 6F, pad connection electrodes 174 and 184 are formed on the substrate 111 provided with the second inorganic encapsulation layer 146 having the second pad contact holes 162.

In more detail, a fourth conductive layer is deposited on the entire surface of the substrate 111 provided with the second inorganic encapsulation layer 146 having the second pad contact holes 162, and the fourth conductive layer is then patterned through a photolithography process and an etching process, thereby forming the pad connection electrodes 174 and 184 of the touch sensing pads 170 and the touch driving pads 180. The pad connection electrodes 174 and 184 are directly connected to the pad electrodes 172 and 182, and are connected to the routing pads 176 and 186 through the first and second pad contact holes 160 and 162.

Figure 7:
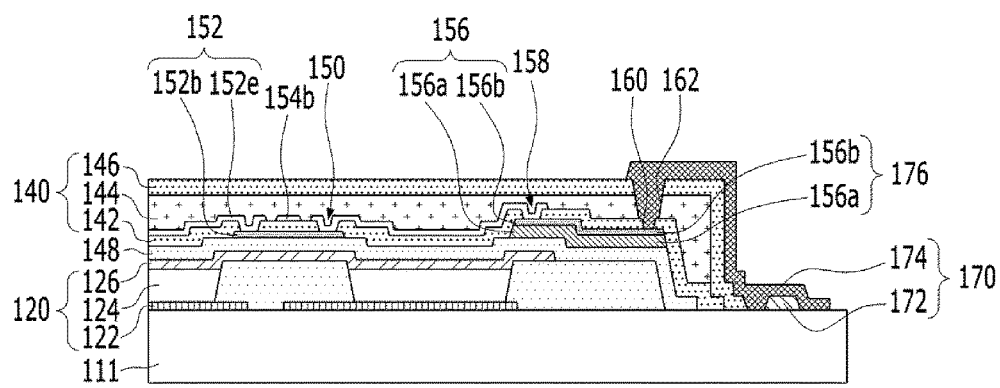
FIG. 7 is a cross-sectional view of an organic light emitting display having touch sensors in accordance with another embodiment of the present invention.

FIG. 7 is a cross-sectional view of an organic light emitting display having touch sensors in accordance with another embodiment of the present invention.

The organic light emitting display shown in FIG. 7 is the same as the organic light emitting display shown in FIGS. 1 and 2, except that touch sensing lines 154 and touch driving lines 152 are disposed so as to intersect each other with a first inorganic encapsulation layer 142 interposed therebetween. Therefore, a detailed description of elements of the organic light emitting display shown in FIG. 7, which are substantially the same as those of the organic light emitting display shown in FIGS. 1 and 2, will be omitted because it is considered to be unnecessary.

The touch driving line 152 includes a plurality of first touch electrodes 152e disposed on the first inorganic encapsulation layer 142, and first bridges 152b to conductively connect the first touch electrodes 152e. The first bridges 152b are formed on an interlayer inorganic layer 148, are exposed through touch contact holes 150 formed through the first inorganic encapsulation layer 142, and are conductively connected to the first touch electrodes 152e. Here, the interlayer inorganic layer 148 is formed of an inorganic insulating material which can be deposited at a low temperature, such as silicon nitride ($SiN_x$), silicon oxide ($SiO_x$), silicon oxynitride (SiON) or aluminum oxide ($Al_2O_3$), in the same manner as the first inorganic encapsulation layer 142.

The touch sensing line 154 includes a plurality of second touch electrodes 154e, and second bridges 154b to conductively connect the second touch electrodes 154e. The second touch electrodes 154e and the second bridges 154b are disposed on the first inorganic encapsulation layer 142 and are conductively connected to each other without contact holes.

Since the touch sensing lines 154 and the touch driving lines 152 intersect each other with the first inorganic encapsulation layer 142 interposed therebetween, mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

Each of touch driving pads 170 and touch sensing pads 180 includes a pad electrode 172 or 182 and a pad connection electrode 174 or 184 disposed on the pad electrode 172 or 182 so as to cover the pad electrode 172 or 182. The pad connection electrodes 174 and 184 of the touch driving pads 170 and the touch sensing pads 180 are conductively connected to first and second routing pads 176 and 186 exposed through first pad contact holes 160 formed through the first inorganic encapsulation layer 142 and second pad contact holes 162 formed through the organic encapsulation layer 144 and the second inorganic encapsulation layer 146. The pad electrodes 172 and 182 of the touch driving pads 170 and the touch sensing pads 180 are formed of a first conductive layer, and the pad connection electrodes 174 and 184 are formed of a fourth conductive layer having a monolayer or multilayer structure using metals having high corrosion resistance and acid resistance, such as Al, Ti, Cu and Mo. For example, the fourth conductive layer has a tri-layer structure, such as Ti/Al/Ti or Mo/Al/Mo.

As such, in the organic light emitting display in accordance with this embodiment of the present invention, the touch driving lines 152 and the touch sensing lines 154 are disposed so as to intersect each other with the first inorganic encapsulation layer 142 of the encapsulation unit 140 interposed therebetween, thereby achieving structure simplification, weight reduction and slimming. In this instance, the organic light emitting display in accordance with the present invention does not require a touch insulating layer having a multilayer structure in a touchscreen, as compared to a related art organic light emitting display, and can thus achieve structure simplification, weight reduction and slimming, assure flexibility and improve transmittance. Further, while, in the related art organic light emitting display, a touchscreen is attached to a display panel through an adhesive, in the organic light emitting display in accordance with the present invention, touch electrodes 152e and 154e are disposed in the encapsulation unit 140, a separate attachment process is omitted and, thus, process simplification and cost reduction can be achieved.

FIGS. 8A to 8F are cross-sectional views illustrating a method of fabricating the organic light emitting display shown in FIG. 7.

Figure 8A:
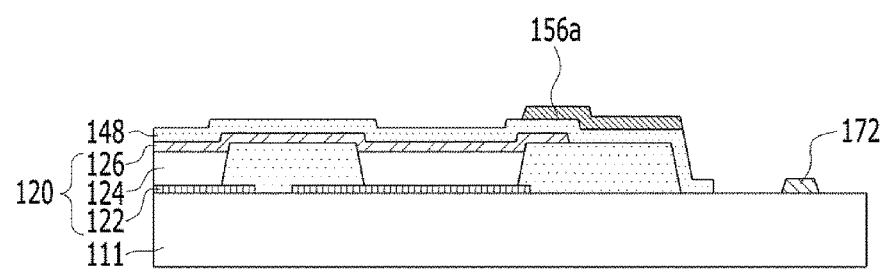
FIGS. 8A to 8F are cross-sectional views illustrating a method of fabricating the organic light emitting display shown in FIG. 7 according to an embodiment.

With reference to FIG. 8A, the interlayer inorganic layer 148, the pad electrodes 172 and 182, the first and second routing pads 176 and 186, the first conductive layer 156a of the first routing lines 156 and the first conductive layer of the second routing lines 166 are formed on the substrate 111 provided with switching transistors, driving transistors, anodes 122, the organic light emitting layer 124 and cathodes 126 formed thereon.

In more detail, an inorganic insulating material is stacked on the substrate 111, provided with the switching transistors, the driving transistors, the anodes 122, the organic light emitting layer 124 and the cathodes 126 formed thereon, through a deposition process using a metal mask, thereby forming the interlayer inorganic layer 148. The interlayer inorganic layer 148 is formed in other regions except for a region in which touch driving pads and touch signal pads will be formed. Thereafter, a first conductive layer is deposited on the entire surface of the interlayer inorganic layer 148, and the first conductive layer is then patterned through a photolithography process and an etching process, thereby forming the first and second routing pads 176 and 186, the first conductive layer 156a of the first routing lines 156, the first conductive layer of the second routing lines 166 and the pad electrodes 172 and 182. Here, the first conductive layer 156a and the pad electrodes 172 and 182 are formed to have a monolayer or multilayer structure using metals having high corrosion resistance and acid resistance, such as Al, Ti, Cu and Mo. For example, the first conductive layer 156a has a tri-layer structure, such as Ti/Al/Ti or Mo/Al/Mo.

Figure 8B:
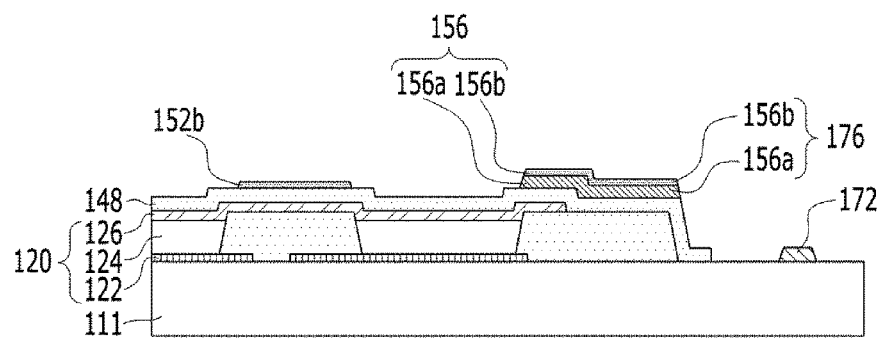

Thereafter, with reference to FIG. 8B, the first and second routing pads 176 and 186, the second conductive layer 156b of the first routing lines 156, the second conductive layer of the second routing lines 166 and the first bridges 152b are formed on the substrate 111 provided with the first conductive layer 156a and the pad electrodes 172 and 182.

In more detail, a second conductive layer is deposited on the entire surface of the substrate 111 provided with the first conductive layer 156a and the pad electrodes 172 and 182, and the second conductive layer is then patterned through a photolithography process and an etching process, thereby forming the first and second routing pads 176 and 186, the second conductive layer 156b of the first routing lines 156, the second conductive layer of the second routing lines 166 and the first bridges 152b. Here, the second conductive layer 156b and the first bridge 152b are formed of an ITO, IZO, IGZO or ZnO-based transparent conductive oxide.

Figure 8C:
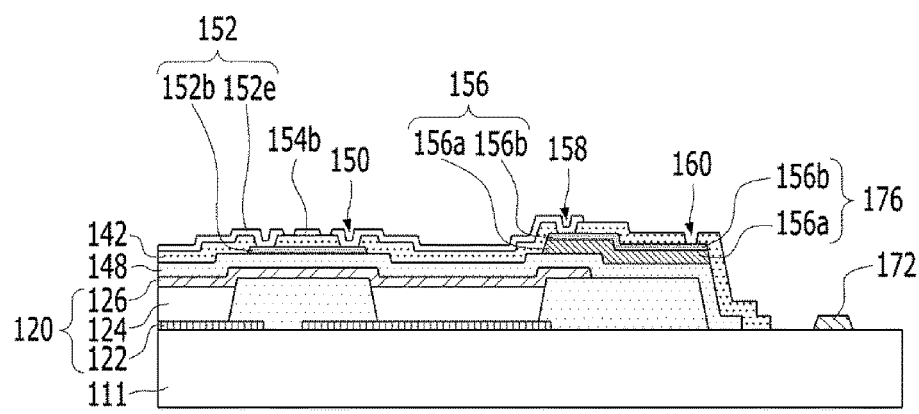

Thereafter, with reference to FIG. 8C, the first inorganic encapsulation layer 142 having touch contact holes 150, first and second routing contact holes 158 and 168 and first pad contact holes 160 is formed on the substrate 111 provided with the second conductive layer 156b and the first bridges 152b.

In more detail, an inorganic insulating material is deposited on the substrate 111 provided with the second conductive layer 156b and the first bridges 152b through a deposition process using a metal mask so as to expose pad electrodes 172 and 182, thereby forming the first inorganic encapsulation layer 142. Thereafter, the first inorganic encapsulation layer 142 is patterned through a photolithography process and an etching process, thereby forming the touch contact holes 150, the routing contact holes 158 and 168 and the first pad contact holes 160. The touch contact holes 150 are formed through the first inorganic encapsulation layer 142 and thus expose the first bridges 152b, the first and second routing contact holes 158 and 168 are formed through the first inorganic encapsulation layer 142 and thus expose the first and second routing lines 156 and 166, and the first pad contact holes 160 are formed through the first inorganic encapsulation layer 142 and thus expose the first and second routing pads 176 and 186.

Figure 8D:
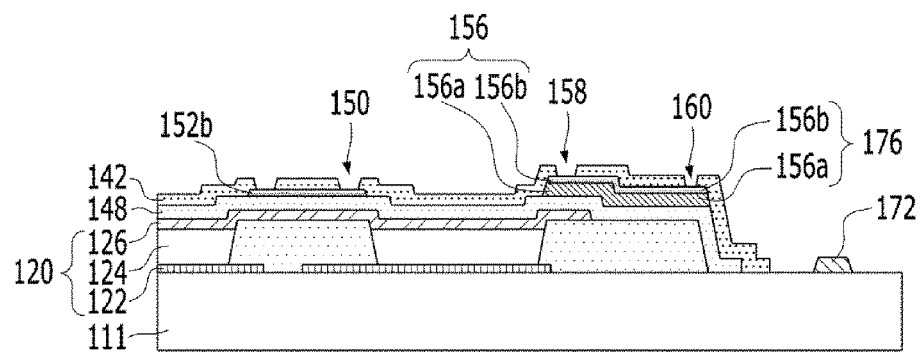

Thereafter, with reference to FIG. 8D, the first and second touch electrodes 152e and 154e and the second bridges 154b are formed on the substrate 111 provided with the first inorganic encapsulation layer 142.

In more detail, a third conductive layer is deposited on the entire surface of the substrate 111 provided with the first inorganic encapsulation layer 142, and the third conductive layer is then patterned through a photolithography process and an etching process, thereby forming the first and second touch electrodes 152e and 154e and the second bridges 154b. Here, the first touch electrodes 152e are conductively connected to the first bridges 152b exposed through the touch contact holes 150.

Figure 8E:
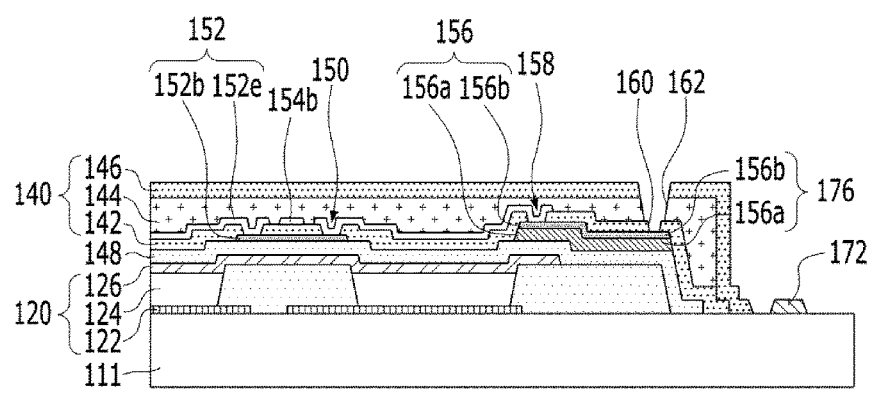

Thereafter, with reference to FIG. 8E, the organic encapsulation layer 144 and the second inorganic encapsulation layer 146 having second pad contact holes 162 is formed on the substrate 111 provided with the first and second touch electrodes 152e and 154e and the second bridges 154b.

In more detail, an organic insulating material and an inorganic insulating material are sequentially deposited on the substrate 111 provided with the first and second touch electrodes 152e and 154e and the second bridges 154b through a deposition process using a metal mask, thereby forming the organic encapsulation layer 144 and the second inorganic encapsulation layer 146. Thereafter, the organic encapsulation layer 144 and the second inorganic encapsulation layer 146 are patterned through a photolithography process and an etching process, thereby forming the second pad contact holes 162. The second pad contact holes 162 are formed through the organic encapsulation layer 144 and the second inorganic encapsulation layer 146, thus being connected to the first pad contact holes 160 vertically.

Figure 8F:
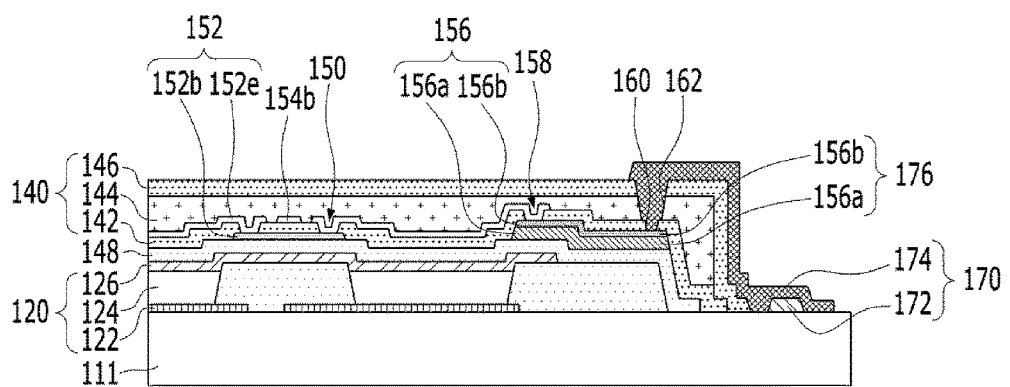

Thereafter, with reference to FIG. 8F, pad connection electrodes 174 and 184 are formed on the substrate 111 provided with the second inorganic encapsulation layer 146 having the second pad contact holes 162.

In more detail, a fourth conductive layer is deposited on the entire surface of the substrate 111 provided with the second inorganic encapsulation layer 146 having the second pad contact holes 162, and the fourth conductive layer is then patterned through a photolithography process and an etching process, thereby forming the pad connection electrodes 174 and 184 of the touch sensing pads 170 and the touch driving pads 180. The pad connection electrodes 174 and 184 are directly connected to the pad electrodes 172 and 182, and are connected to the routing pads 176 and 186 through the first and second pad contact holes 160 and 162.

Figure 9:
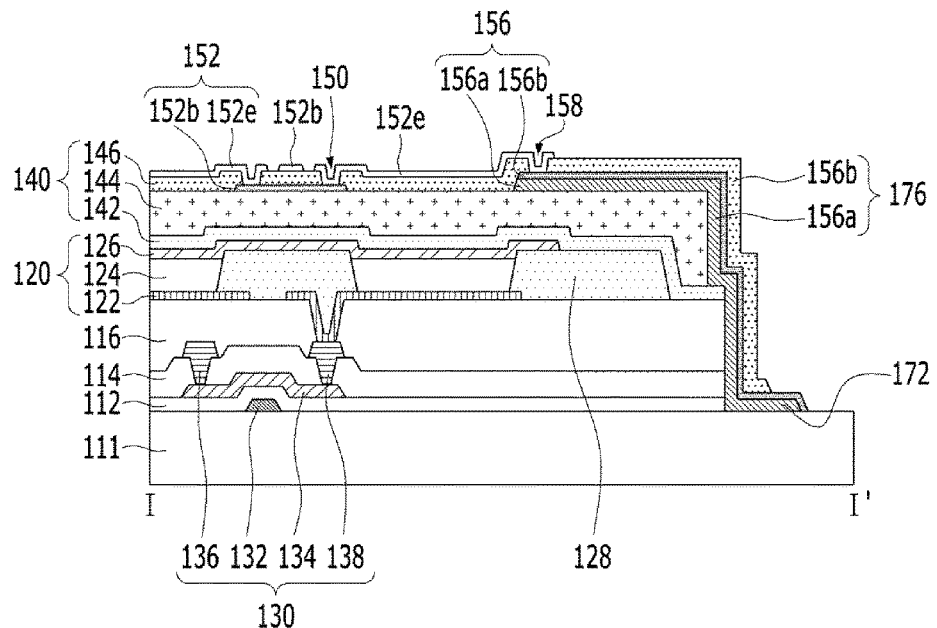
FIG. 9 is a cross-sectional view of an organic light emitting display having touch sensors in accordance with another embodiment of the present invention.

Although the above-described embodiments of the present invention exemplarily describe that the routing lines 156 and 166 and the pad electrodes 172 and 182 are conductively connected through the routing pads 176 and 186 and the pad connection electrodes 174 and 184, pad electrodes 172 can extend from the routing lines 156, as exemplarily shown in FIG. 9, and thus the routing lines 156 and the pad electrodes 172 can be conductively connected directly to each other without routing pads 176 and 186 and pad connection electrodes 174 and 184. In this instance, the routing lines 156 are disposed on the side and upper surfaces of any one of remaining encapsulation layers except for an encapsulation layer located at the uppermost position of an encapsulation unit 140. For example, as exemplarily shown in FIG. 9, the routing lines 156 are disposed on the side and upper surfaces of the organic encapsulation layer 144 located under the second inorganic encapsulation layer 146 located at the uppermost position of the encapsulation unit 140. Thereby, if moisture penetrates through the routing lines 156 and the pad electrodes 172, the first inorganic encapsulation layer 142 and the organic encapsulation layer 144 can block moisture.

Figure 10:
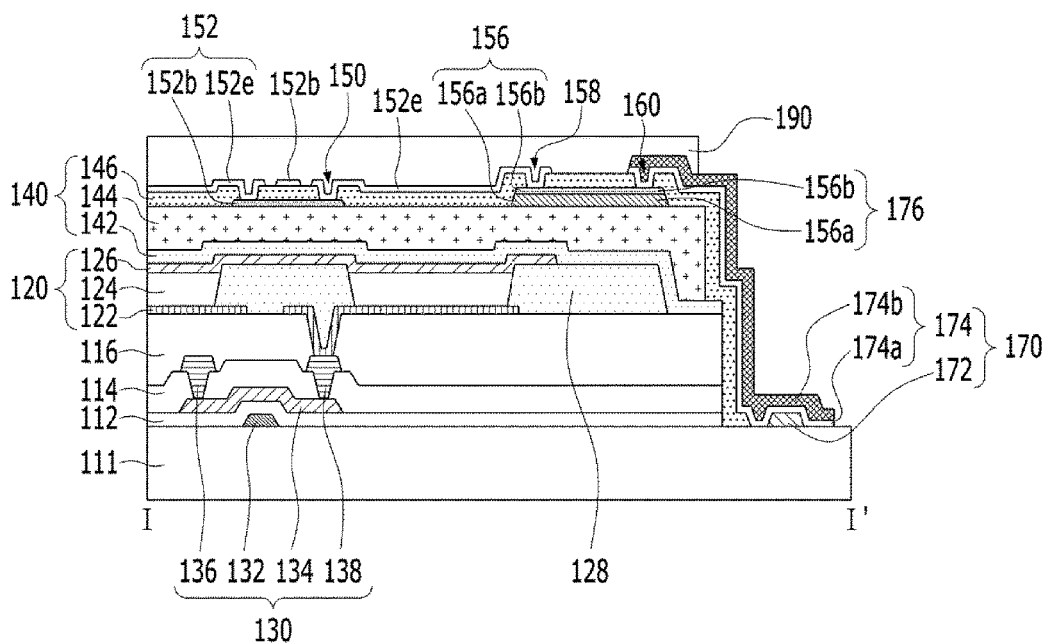
FIG. 10 is a cross-sectional view of an organic light emitting display having touch sensors in accordance with another embodiment of the present invention.

Further, the touch sensing lines 154 and the touch driving lines 152 in accordance with the above-described embodiments of the present invention are protected by a protective film 190, as exemplarily shown in FIG. 10. As the protective film 190, a circularly polarizing plate can be used or a separate film formed of epoxy or acryl can be used.

Moreover, although the present invention exemplarily illustrates that the bridges 152b and the first touch electrodes 152e of the touch driving lines 152 are disposed on different planes and are then connected through the touch contact holes 150, the bridges 154b and the second touch electrodes 154e of the touch sensing lines 154 can be disposed on different planes and be then connected through touch contact holes.

As apparent from the above description, in an organic light emitting display having touch sensors in accordance with the present invention, touch driving lines and touch sensing lines are disposed so as to intersect each other with at least one of a first inorganic encapsulation layer, a second inorganic encapsulation layer and an organic encapsulation layer of an encapsulation unit, interposed therebetween. Therefore, the organic light emitting display in accordance with the present invention does not require a touch insulating layer, which is disposed between touch driving lines and touch sensing lines of a related art organic light emitting display, and may thus achieve structure simplification, weight reduction and slimming. Further, the organic light emitting display in accordance with the present invention can assure flexibility and enhance transmittance. Moreover, the organic light emitting display in accordance with the present invention disposes touch electrodes in the encapsulation unit and does not require a separate attachment process, thereby simplifying the overall process and reducing manufacturing costs.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display comprising:
a plurality of light emitting elements disposed on a substrate;
an encapsulation unit disposed on the plurality of light emitting elements and including a plurality of inorganic encapsulation layers and at least one organic encapsulation layer disposed between the plurality of inorganic encapsulation layers;
a plurality of touch sensing lines and a plurality of touch driving lines intersecting each other, at least one of the plurality of touch sensing lines or at least one of the plurality of touch driving lines being disposed on at least one of the plurality of inorganic encapsulation layers or the at least one organic encapsulation layer;
a plurality of routing lines respectively connected to the plurality of touch driving lines and the plurality of touch sensing lines;
a plurality of routing pads respectively connected to the plurality of routing lines;
a plurality of touch pad electrodes disposed outside at least one of the plurality of inorganic encapsulation layers or the at least one organic encapsulation layer of the encapsulation unit; and
a plurality of pad connection electrodes conductively connecting the plurality of routing pads to the plurality of touch pad electrodes,
wherein at least a portion of the plurality of pad connection electrodes is disposed between a side surface of the encapsulation unit and the plurality of touch pad electrodes.

2. The organic light emitting display according to claim 1, further comprising:
wherein the plurality of pad connection electrodes are disposed on a side surface and an upper surface of an uppermost inorganic encapsulation layer among the plurality of inorganic encapsulation layers within the encapsulation unit.

3. The organic light emitting display according to claim 1, further comprising:
wherein the plurality of routing lines are disposed on a side surface and an upper surface of at least one of the plurality of inorganic encapsulation layers or the at least one organic encapsulation layer and between an uppermost inorganic encapsulation layer among the plurality of inorganic encapsulation layers within the encapsulation unit and the at least one of the plurality of inorganic encapsulation layers or the at least one organic encapsulation layer.

4. The organic light emitting display according to claim 1, wherein the encapsulation unit includes:
a first inorganic encapsulation layer;
an organic encapsulation layer disposed on the first inorganic encapsulation layer; and
a second inorganic encapsulation layer disposed on the organic encapsulation layer,
wherein the organic encapsulation layer is disposed between the first inorganic encapsulation layer and the second inorganic encapsulation layer, and
wherein the first inorganic encapsulation layer is closer to the plurality of light emitting elements than the organic encapsulation layer and the second inorganic encapsulation layer.

5. The organic light emitting display according to claim 4, further comprising an interlayer inorganic layer disposed between the plurality of light emitting elements and the first inorganic encapsulation layer,
wherein one of the plurality of touch driving lines and the plurality of touch sensing lines is disposed on the interlayer inorganic layer, and
wherein a remaining one of the plurality of touch driving lines and the plurality of touch sensing lines, other than the one of the plurality of touch driving lines and the plurality of touch sensing lines, is disposed on the first inorganic encapsulation layer.

6. The organic light emitting display according to claim 4, wherein the second inorganic encapsulation layer covers an upper surface and a side surface of the organic encapsulation layer and an upper surface and a side surface of the first inorganic encapsulation layer.

7. The organic light emitting display according to claim 1, wherein each the plurality of touch driving lines includes:
a plurality of first touch electrodes arranged in a first direction; and
a plurality of first bridges configured to connect the plurality of first touch electrodes,
wherein each of the plurality of touch sensing lines includes:
a plurality of second touch electrodes arranged in a second direction intersecting the first direction; and
a plurality of second bridges configured to connect the plurality of second touch electrodes,
wherein the encapsulation unit includes:
a first inorganic encapsulation layer;
an organic encapsulation layer disposed on the first inorganic encapsulation layer; and
a second inorganic encapsulation layer disposed on the organic encapsulation layer,
wherein the organic encapsulation layer is disposed between the first inorganic encapsulation layer and the second inorganic encapsulation layer, and
wherein the first inorganic encapsulation layer is closer to the plurality of light emitting elements than the organic encapsulation layer and the second inorganic encapsulation layer.

8. The organic light emitting display according to claim 7, wherein the plurality of first touch electrodes, the plurality of second touch electrodes and the plurality of second bridges are disposed on the second inorganic encapsulation layer,
wherein the plurality of first bridges are disposed on the organic encapsulation layer, and
wherein the plurality of first touch electrodes are connected to the plurality of first bridges through touch contact holes in the second inorganic encapsulation layer.

9. The organic light emitting display according to claim 7, wherein the plurality of first electrodes, the plurality of second touch electrodes and the plurality of second bridges are disposed on the organic encapsulation layer,
wherein the plurality of first bridges are disposed on the first inorganic encapsulation layer, and
wherein the plurality of first touch electrodes are connected to the plurality of first bridges through touch contact holes in the organic encapsulation layer.

10. The organic light emitting display according to claim 7, further comprising an interlayer inorganic layer disposed between the plurality of light emitting elements and the first inorganic encapsulation layer, wherein the plurality of first electrodes, the plurality of second touch electrodes and the plurality of second bridges are disposed on the first inorganic encapsulation layer, wherein the plurality of first bridges are disposed on the interlayer inorganic layer, and wherein the plurality of first touch electrodes are connected to the plurality of first bridges through touch contact holes in the first inorganic encapsulation layer.

11. The organic light emitting display according to claim 8, further comprising a bank configured to provide an emission region for an organic light emitting layer of a light emitting element among the plurality of light emitting elements, and wherein the plurality of first bridges and the plurality of second bridges overlap with the bank.

12. The organic light emitting display according to claim 11, wherein the plurality of first bridges and the plurality of second bridges overlap with the bank without overlapping with any of the plurality of light emitting elements.

13. The organic light emitting display according to claim 1, wherein the plurality of touch sensing lines and the plurality of touch driving lines are both disposed on an upper surface of the encapsulation unit, and wherein the encapsulation unit is disposed between the plurality of light emitting elements, and the plurality of touch sensing lines and the plurality of touch driving lines.

14. The organic light emitting display according to claim 1, further comprising:

a plurality of bank portions dividing the plurality of light emitting elements from one another, wherein the locations where the plurality of touch sensing lines cross the plurality of touch driving lines overlap with the plurality of bank portions without overlapping with any of the plurality of light emitting elements.

15. The organic light emitting display according to claim 1, wherein an outer edge of the at least one organic encapsulation layer is sealed between two of the plurality of inorganic encapsulation layers.

16. The organic light emitting display according to claim 1, wherein one of the plurality of inorganic encapsulation layers contacts the substrate and extends to an uppermost surface of the encapsulation unit and contacts both the plurality of touch sensing lines and the plurality of touch driving lines.

17. The organic light emitting display according to claim 1, wherein at least one of the plurality of inorganic encapsulation layers or the at least one organic encapsulation layer is disposed between the plurality of touch sensing lines and the plurality of touch driving lines at locations where the plurality of touch sensing lines cross the plurality of touch driving lines.

18. An organic light emitting display comprising:

a plurality of light emitting elements disposed on a substrate;

an encapsulation unit disposed on the plurality of light emitting elements and including a plurality of inorganic encapsulation layers and at least one organic encapsulation layer disposed between the plurality of inorganic encapsulation layers; and a plurality of touch sensing lines and a plurality of touch driving lines intersecting each other, wherein at least one of the plurality of inorganic encapsulation layers or the at least one organic encapsulation layer is disposed between the plurality of touch sensing lines and the plurality of touch driving lines at locations where the plurality of touch sensing lines cross the plurality of touch driving lines, wherein organic light emitting display further comprises:

a plurality of routing lines respectively connected to the plurality of touch driving lines and the plurality of touch sensing lines;

a plurality of routing pads respectively connected to the plurality of routing lines;

a plurality of pad electrodes disposed in an edge area of the substrate and exposed by the encapsulation unit; and a plurality of pad connection electrodes configured to conductively connect the plurality of routing pads to the plurality of pad electrodes, and wherein the plurality of pad connection electrodes are disposed on a side surface and an upper surface of an uppermost inorganic encapsulation layer among the plurality of inorganic encapsulation layers within the encapsulation unit.

19. The organic light emitting display according to claim 18, wherein the plurality of touch sensing lines and the plurality of touch driving lines are both disposed outside of the encapsulation unit.

* * * * *